United States Patent
Marelli et al.

(10) Patent No.: US 10,291,263 B2
(45) Date of Patent: May 14, 2019

(54) AUTO-LEARNING LOG LIKELIHOOD RATIO

(71) Applicant: IP GEM GROUP, LLC, Irvine, CA (US)

(72) Inventors: Alessia Marelli, Dalmine (IT); Rino Micheloni, Turate (IT)

(73) Assignee: IP GEM GROUP, LLC, Irvine, CA (US)

( * ) Notice: Subject to any disclaimer, the term of this patent is extended or adjusted under 35 U.S.C. 154(b) by 8 days.

(21) Appl. No.: 15/658,151

(22) Filed: Jul. 24, 2017

(65) Prior Publication Data

US 2018/0034485 A1  Feb. 1, 2018

Related U.S. Application Data

(60) Provisional application No. 62/488,215, filed on Apr. 21, 2017, provisional application No. 62/367,789, filed on Jul. 28, 2016.

(51) Int. Cl.
| | |
|---|---|
| *H03M 13/45* | (2006.01) |
| *G11C 16/26* | (2006.01) |
| *G11C 11/56* | (2006.01) |
| *G11C 16/28* | (2006.01) |
| *G11C 16/34* | (2006.01) |

(Continued)

(52) U.S. Cl.
CPC ....... *H03M 13/458* (2013.01); *G11C 11/5628* (2013.01); *G11C 16/26* (2013.01); *G11C 16/28* (2013.01); *G11C 16/349* (2013.01); *G11C 16/3422* (2013.01); *G11C 29/028* (2013.01); *G11C 16/0483* (2013.01)

(58) Field of Classification Search
CPC ....................................................... G06F 11/104
USPC .................................. 714/807, 803, 805, 802
See application file for complete search history.

(56) References Cited

U.S. PATENT DOCUMENTS

| | | |
|---|---|---|
| 815,137 A | 3/1906 | Beecher |
| 5,615,235 A | 3/1997 | Kakuishi et al. |

(Continued)

OTHER PUBLICATIONS

NVM Express, revision 1.0; Intel Corporation;, Jul. 12, 2011, pp. 103-106 and 110-114.

(Continued)

*Primary Examiner* — Fritz Alphonse
(74) *Attorney, Agent, or Firm* — Glass & Associates; Kenneth Glass

(57) ABSTRACT

A method for identifying log likelihood ratio (LLR) values includes programming codewords into nonvolatile memory devices in response to receiving host-requested write instructions and performing background reads of the programmed codewords in a block at a default threshold voltage, at one or more threshold voltage offset that is less than the default threshold voltage and at one or more threshold voltage offset that is greater than the default threshold voltage. One of the background reads is decoded to identify the stored codeword(s) and a set of LLR values is identified using the stored read results and the identified codeword(s). The process of performing background reads, storing, decoding and identifying is repeated to identify a set of LLR values for each block and further to identify updated sets of LLR values. Host-requested reads are performed and are decoded using LLR values from the updated set of LLR values corresponding to the block that was read.

20 Claims, 16 Drawing Sheets

(51) Int. Cl.
  *G11C 29/02* (2006.01)
  *G11C 16/04* (2006.01)

(56) References Cited

U.S. PATENT DOCUMENTS

| | | | |
|---|---|---|---|
| 5,732,092 A | 3/1998 | Shinohara | |
| 5,822,244 A | 10/1998 | Hansen et al. | |
| 5,875,343 A | 2/1999 | Binford et al. | |
| 6,115,788 A | 9/2000 | Thowe | |
| 6,148,360 A | 11/2000 | Leak et al. | |
| 6,412,041 B1 | 6/2002 | Lee et al. | |
| 6,539,515 B1 | 3/2003 | Gong | |
| 6,567,313 B2 | 5/2003 | Tanaka et al. | |
| 6,633,856 B2 | 10/2003 | Richardson et al. | |
| 6,725,409 B1 | 4/2004 | Wolf | |
| 6,789,227 B2 | 9/2004 | De Souza et al. | |
| 6,871,168 B1 | 3/2005 | Tanaka et al. | |
| 6,895,547 B2 | 5/2005 | Eleftheriou et al. | |
| 6,934,804 B2 | 8/2005 | Hashemi | |
| 6,963,507 B2 | 11/2005 | Tanaka et al. | |
| 6,976,194 B2 | 12/2005 | Cypher | |
| 6,976,197 B2 | 12/2005 | Faust et al. | |
| 7,032,081 B1 | 4/2006 | Gefen et al. | |
| 7,050,334 B2 | 5/2006 | Kim et al. | |
| 7,116,732 B2 | 10/2006 | Worm et al. | |
| 7,206,992 B2 | 4/2007 | Xin et al. | |
| 7,209,527 B2 | 4/2007 | Smith et al. | |
| 7,237,183 B2 | 6/2007 | Xin | |
| 7,324,559 B2 | 1/2008 | McGibney | |
| 7,376,015 B2 | 5/2008 | Tanaka et al. | |
| 7,450,668 B2 | 11/2008 | Ghosh et al. | |
| 7,457,906 B2 | 11/2008 | Pettey et al. | |
| 7,472,331 B2 | 12/2008 | Kim et al. | |
| 7,484,158 B2 | 1/2009 | Sharon et al. | |
| 7,529,215 B2 | 5/2009 | Osterling | |
| 7,567,472 B2 | 7/2009 | Gatzemeier et al. | |
| 7,620,784 B2 | 11/2009 | Panabaker et al. | |
| 7,650,480 B2 | 1/2010 | Jiang et al. | |
| 7,694,047 B1 | 4/2010 | Alston | |
| 7,708,195 B2 | 5/2010 | Yoshida et al. | |
| 7,739,472 B2 | 6/2010 | Guterman et al. | |
| 7,752,346 B2 | 7/2010 | Talayco et al. | |
| 7,801,233 B1 | 9/2010 | Chow et al. | |
| 7,860,930 B2 | 12/2010 | Freimuth et al. | |
| 7,904,793 B2 | 3/2011 | Mokhlesi et al. | |
| 7,930,623 B2 | 4/2011 | Pisek et al. | |
| 7,937,641 B2 | 5/2011 | Amidi | |
| 7,945,721 B1 | 5/2011 | Johnsen et al. | |
| 7,958,430 B1 | 6/2011 | Kolokowsky et al. | |
| 7,975,193 B2 | 7/2011 | Johnson | |
| 8,094,508 B2 | 1/2012 | Gatzemeier et al. | |
| 8,140,930 B1 | 3/2012 | Maru | |
| 8,176,367 B2 | 5/2012 | Dreifus et al. | |
| 8,219,894 B2 | 7/2012 | Au et al. | |
| 8,223,745 B2 | 7/2012 | Johnsen et al. | |
| 8,228,728 B1 | 7/2012 | Yang et al. | |
| 8,244,946 B2 | 8/2012 | Gupta et al. | |
| 8,245,112 B2 | 8/2012 | Hicken et al. | |
| 8,245,117 B1 | 8/2012 | Wu | |
| 8,250,286 B2 | 8/2012 | Yeh et al. | |
| 8,254,112 B2 | 8/2012 | Yang et al. | |
| 8,255,770 B2 | 8/2012 | Park et al. | |
| 8,259,498 B2 | 9/2012 | Yogev et al. | |
| 8,259,506 B1 | 9/2012 | Sommer et al. | |
| 8,261,136 B2 | 9/2012 | D'Abreu et al. | |
| 8,281,217 B2 | 10/2012 | Kim et al. | |
| 8,281,227 B2 | 10/2012 | Inskeep et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,341,502 B2 | 12/2012 | Steiner et al. | |
| 8,351,258 B1 | 1/2013 | Yang et al. | |
| 8,359,522 B2 | 1/2013 | Gunnam et al. | |
| 8,392,789 B2 | 3/2013 | Biscondi et al. | |
| 8,402,201 B2 | 3/2013 | Strasser et al. | |
| 8,418,023 B2 | 4/2013 | Gunnam et al. | |
| 8,429,325 B1 | 4/2013 | Onufryk et al. | |
| 8,429,497 B2 | 4/2013 | Tu et al. | |
| 8,473,812 B2 | 6/2013 | Ramamoorthy et al. | |
| 8,493,791 B2 | 7/2013 | Karakulak et al. | |
| 8,504,885 B2 | 8/2013 | Haratsch et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |
| 8,638,602 B1 | 1/2014 | Horn et al. | |
| 8,640,005 B2 | 1/2014 | Wilkerson et al. | |
| 8,645,613 B2 | 2/2014 | Tan et al. | |
| 8,656,257 B1 | 2/2014 | Micheloni et al. | |
| 8,665,648 B2 | 3/2014 | Mun et al. | |
| 8,694,849 B1 | 4/2014 | Micheloni et al. | |
| 8,694,855 B1 | 4/2014 | Micheloni et al. | |
| 8,706,956 B2 | 4/2014 | Cagno et al. | |
| 8,707,122 B1 | 4/2014 | Micheloni et al. | |
| 8,737,141 B2 | 5/2014 | Melik-Martirosian | |
| 8,739,008 B2 | 5/2014 | Liu et al. | |
| 8,755,229 B1 | 6/2014 | Visconti et al. | |
| 8,762,620 B2 | 6/2014 | Prins et al. | |
| 8,769,374 B2 | 7/2014 | Franceschini et al. | |
| 8,775,913 B2 | 7/2014 | Haratsch et al. | |
| 8,787,428 B2 | 7/2014 | Dai et al. | |
| 8,856,622 B2 | 10/2014 | Ramamoorthy et al. | |
| 8,898,372 B2 | 11/2014 | Yeh | |
| 8,917,734 B1 | 12/2014 | Brown | |
| 8,924,824 B1 | 12/2014 | Lu | |
| 8,953,373 B1 | 2/2015 | Haratsch et al. | |
| 8,958,247 B2 | 2/2015 | Asaoka et al. | |
| 8,959,280 B2 | 2/2015 | Ma et al. | |
| 8,984,216 B2 | 3/2015 | Fillingim | |
| 8,995,197 B1 | 3/2015 | Steiner et al. | |
| 8,995,302 B1 | 3/2015 | Brown et al. | |
| 9,025,495 B1 | 5/2015 | Onufryk et al. | |
| 9,058,289 B2 | 6/2015 | Tai et al. | |
| 9,142,314 B2 | 9/2015 | Beltrami et al. | |
| 9,164,891 B2 | 10/2015 | Karamcheti et al. | |
| 9,244,763 B1 | 1/2016 | Kankani et al. | |
| 9,251,909 B1 | 2/2016 | Camp et al. | |
| 9,257,182 B2 | 2/2016 | Grunzke | |
| 9,268,531 B1 | 2/2016 | Son et al. | |
| 9,292,428 B2 | 3/2016 | Kanamori et al. | |
| 9,294,132 B1 | 3/2016 | Peleato-Inarrea | |
| 9,397,701 B1 * | 7/2016 | Micheloni | H03M 13/13 |
| 9,444,655 B2 | 9/2016 | Sverdlov et al. | |
| 9,590,656 B2 * | 3/2017 | Micheloni | H03M 13/1111 |
| 9,886,214 B2 | 2/2018 | Micheloni et al. | |
| 9,916,906 B2 | 3/2018 | Wu et al. | |
| 2002/0051501 A1 | 5/2002 | Demjanenko et al. | |
| 2002/0129308 A1 | 9/2002 | Kinoshita et al. | |
| 2002/0181438 A1 | 12/2002 | McGibney | |
| 2003/0033567 A1 | 2/2003 | Tamura et al. | |
| 2003/0104788 A1 | 6/2003 | Kim | |
| 2003/0225970 A1 | 12/2003 | Hashemi | |
| 2004/0088636 A1 | 5/2004 | Cypher | |
| 2004/0123230 A1 | 6/2004 | Lee et al. | |
| 2004/0136236 A1 | 7/2004 | Cohen et al. | |
| 2004/0181735 A1 | 9/2004 | Xin | |
| 2004/0234150 A1 | 11/2004 | Chang | |
| 2004/0252791 A1 | 12/2004 | Shen et al. | |
| 2004/0268015 A1 | 12/2004 | Pettey et al. | |
| 2005/0010846 A1 | 1/2005 | Kikuchi et al. | |
| 2005/0226355 A1 | 10/2005 | Kibune et al. | |
| 2005/0248999 A1 | 11/2005 | Tamura et al. | |
| 2005/0252791 A1 | 11/2005 | Pechtold et al. | |
| 2005/0286511 A1 | 12/2005 | Johnsen et al. | |
| 2006/0039370 A1 | 2/2006 | Rosen et al. | |
| 2006/0050694 A1 | 3/2006 | Bury et al. | |
| 2006/0126728 A1 | 6/2006 | Yu et al. | |
| 2006/0206655 A1 | 9/2006 | Chappell et al. | |
| 2006/0282603 A1 | 12/2006 | Onufryk et al. | |
| 2007/0050688 A1 | 3/2007 | Thayer | |
| 2007/0089031 A1 | 4/2007 | Huffman et al. | |
| 2007/0101225 A1 | 5/2007 | Moon et al. | |
| 2007/0118743 A1 | 5/2007 | Thornton et al. | |
| 2007/0136628 A1 | 6/2007 | Doi et al. | |

(56) References Cited

U.S. PATENT DOCUMENTS

| | | |
|---|---|---|
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281771 A1 | 9/2014 | Yoon et al. |
| 2014/0281800 A1* | 9/2014 | Micheloni ........... G06F 11/1012 714/759 |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0072527 A1 | 3/2016 | Tadokoro et al. |
| 2016/0155507 A1 | 6/2016 | Grunzke |
| 2016/0179406 A1 | 6/2016 | Gorobets et al. |
| 2016/0247581 A1 | 8/2016 | Yoshida et al. |
| 2016/0293259 A1 | 10/2016 | Kim et al. |
| 2017/0147135 A1 | 5/2017 | Higashibeppu |
| 2017/0213597 A1 | 7/2017 | Micheloni et al. |
| 2018/0033490 A1 | 2/2018 | Marelli et al. |

OTHER PUBLICATIONS

NVM Express, Revision 1.0; Intel Corporation, Mar. 1, 2011, pp. 1-122.

RapidIO, PCI Express, and Gigabit Ethernet Comparison: Pros and Cons of Using Three Interconnects in Embedded Systems; RapidIO Trade Association, Technical White Paper, Revision 03,, May 2005, 1-36.

PCI Express Base Specification Revision 3.0 (PCI Express Base Expression, PCISIG, hereinafter "PCIExpress"), Nov. 10, 2010, 1-860.

RFC 793: Transmission Control Protocol, RFC 793, University of Southern California, IETF,, Sep. 1981, pp. 1-89.

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

(56) References Cited

OTHER PUBLICATIONS

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.
International Search Report and Written Opinion of the International Searching Authority dated Oct. 23, 2017 International application No. PCTUS2017/044037.
International Search Report and Written Opinion of the International Searching Authority dated Jun. 10, 2017, International application No. PCT/US2017/043799.

\* cited by examiner

AUTO-LEARNING LOG LIKELIHOOD RATIO

BACKGROUND

Error correction methods that use soft information have been widely adopted to obtain the low levels of Uncorrectable Bit Error Rate (UBER) required for client and enterprise Solid State Drives (SSD's). Error correction methods that use soft information typically require testing sample flash memory devices in a lab to identify Log Likelihood Ratio (LLR) values that indicate the Bit Error Rate (BER) of the tested devices. The LLR's are then stored in tables in each SSD that are used by the memory controller for decoding reads of NAND flash memory chips.

The process of characterizing NAND flash memory chips is expensive and time consuming. In addition, the characteristics of NAND flash memory chips change during the lifetime of the NAND flash memory device, making accurate characterization difficult and requiring the storage of numerous LLR tables. Also, the storage space required for storing the LLR tables adds expense to the SSD.

Accordingly, there is a need for a method and apparatus that will allow for error correction using soft information that does not require lab testing of exemplary NAND flash memory chips and that will provide LLR values that accurately indicate the BER of the NAND flash memory chips.

SUMMARY

A method for identifying log likelihood ratio (LLR) values and for decoding codewords using the identified LLR values is disclosed. The method includes programming codewords into nonvolatile memory devices in response to receiving host-requested write instructions and performing background reads of at least one codeword of the programmed codewords in a block of the nonvolatile memory devices at a default threshold voltage, at one or more threshold voltage offset that is less than the default threshold voltage and at one or more threshold voltage offset that is greater than the default threshold voltage. The results of the background reads are stored and at least one of the background reads is decoded to identify the codeword(s). A set of LLR values are identified using the stored read results and the identified codeword(s) and the process of performing background reads, storing, decoding and the identifying is repeated to identify a set of LLR values for each block of the nonvolatile memory devices and to identify updated sets of LLR values. Host-requested reads are performed and the host-requested reads are decoded using LLR values from the updated set of LLR values corresponding to the block that was read in the host-requested read.

A nonvolatile memory controller includes a write circuit coupled to a plurality of nonvolatile memory devices, the write circuit configured to program codewords into each of the nonvolatile memory devices in response to receiving host-requested write instructions. A read circuit is configured to perform background reads of at least one of the programmed codewords in a block of the nonvolatile memory devices at a default threshold voltage, at one or more threshold voltage offset that is less than the default threshold voltage and at one or more threshold voltage offset that is greater than the default threshold voltage. A decoder circuit is configured to decode at least one of the background reads to identify the codeword(s). A LLR circuit is configured to identify a set of LLR values corresponding to the default threshold voltage using the read results and the identified codeword(s). The nonvolatile memory controller continues to perform the background reads, to decode at least one of the background reads, and to identify sets of LLR values, to identify a set of LLR values for each block of the nonvolatile memory devices and to identify updated sets of LLR values during the lifetime of the nonvolatile memory system. A read circuit is configured to perform host-requested reads of the nonvolatile memory devices and a decoder circuit decodes the results of the host-requested read using LLR values from the updated set of LLR values corresponding to the block that was read in the host-requested read.

A nonvolatile memory system is disclosed that includes a plurality of nonvolatile memory devices, a nonvolatile memory controller that is coupled to the nonvolatile memory devices, a write circuit, a read circuit, and a log likelihood ratio (LLR) circuit. The write circuit is configured to program the nonvolatile memory devices to store the user data in the nonvolatile memory devices in response to receiving host-requested write instructions that include user data. The read circuit is configured to perform background reads of representative pages of a page group at a default threshold voltage within each threshold voltage region required to read the representative pages, at one or more threshold voltage offset that is less than the default threshold voltage within each threshold voltage region required to read the representative pages and at one or more threshold voltage offset that is greater than the default threshold voltage within each threshold voltage region required to read the representative pages. The decoder circuit is configured to decode the results from some of the background reads of representative pages to identify codewords stored in the representative pages. The LLR circuit is configured to identify a set of LLR values corresponding to each threshold voltage region required to read the representative pages using the read results and the identified codewords. The read circuit is configured to continue to perform the background reads and to decode the results from some of the background reads, and the LLR circuit is configured to continue to identify sets of LLR values, to identify a set of LLR values corresponding to each threshold voltage region required to read the representative pages of each page group and is further configured to continue to perform the background reads and to identify updated sets of LLR values. The read circuit is configured to perform host-requested reads of the nonvolatile memory devices and the decoder circuit is configured to decode the results of the host-requested reads using LLR values from the updated set of LLR values corresponding to the page group of the page that was read in the host-requested read.

The method and apparatus of the present invention allows for error correction using soft information obtained during operation of the nonvolatile memory system and does not require lab testing of sample NAND flash memory chips to generate LLR tables for different time periods during the lifetime of the nonvolatile memory devices. In addition, by performing LLR calculations on the actual NAND device being used, and by continuing to perform background testing as the NAND device ages, the methods and apparatus of the present invention provide LLR values that accurately indicate the error probability during the entire lifetime of the nonvolatile memory system. This reduces bit error rate (BER) and extends the useful life of the NAND flash memory chips. In addition, the number of read errors is reduced, resulting in reduced read latency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
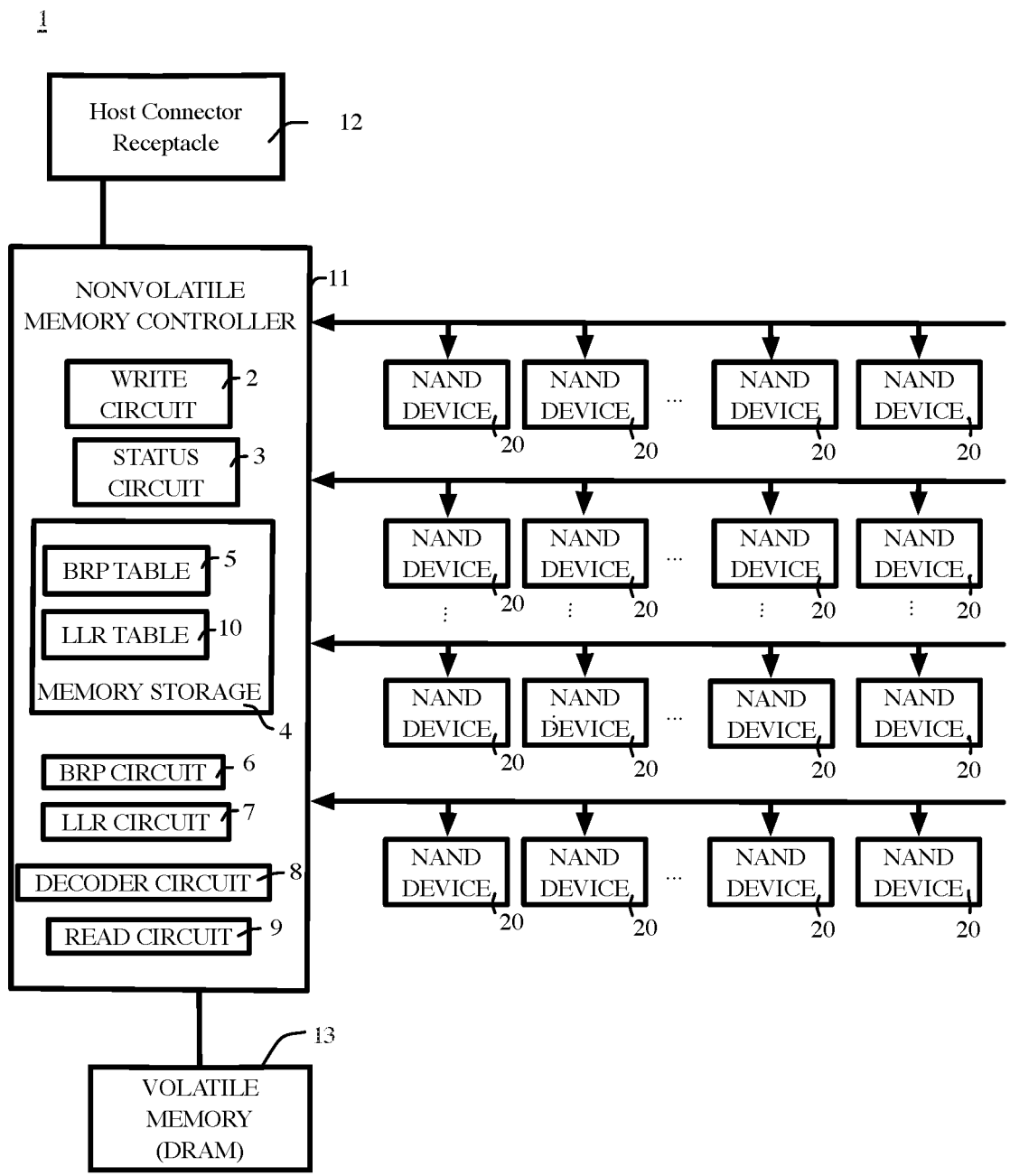
FIG. 1 is a block diagram illustrating a nonvolatile memory system in accordance with an embodiment of the present invention.

A nonvolatile memory system 1 is shown in FIG. 1 to include a nonvolatile memory controller 11 coupled to a plurality of nonvolatile memory devices 20 for storing data. In the present embodiment, the nonvolatile memory devices 20 are NAND devices and nonvolatile memory system 1 is a solid state drive (SSD) that includes one or more circuit boards onto which host connector receptacle 12, nonvolatile memory controller 11 and nonvolatile memory devices 20 are attached. Nonvolatile memory system 1 may also include one or more volatile memory device 13 such as a Dynamic Random Access Memory (DRAM) attached to the circuit board and to nonvolatile memory controller 11.

Nonvolatile memory controller 11 is configured to receive read and write instructions from a host computer through host connector receptacle 12 of FIG. 1, and to perform program operations, erase operations and read operations on memory cells of nonvolatile memory devices 20 to complete the instructions from the host computer. For example, upon receiving a write instruction from the host computer via host connector receptacle 12, memory controller 11 is operable to store data in nonvolatile memory system 1 by performing program operations (and when required, erase operations) on one or more nonvolatile memory device 20, and upon receiving a read instruction nonvolatile memory controller 11 is operable to read data from nonvolatile memory system 1 by performing the host-requested read operations on one or more nonvolatile memory device 20. The term "host-requested read," as used in the present application, includes only those reads that are performed in response to an instruction received from an external device (e.g., received at host connector receptacle 12), and specifically includes read requests received from a host computer or other external computing device. Host-requested reads do not include background reads performed during a background reference positioning operation, or reads performed pursuant to housekeeping operations such as garbage collection, wear leveling and block recycling, without limitation.

Figure 2:
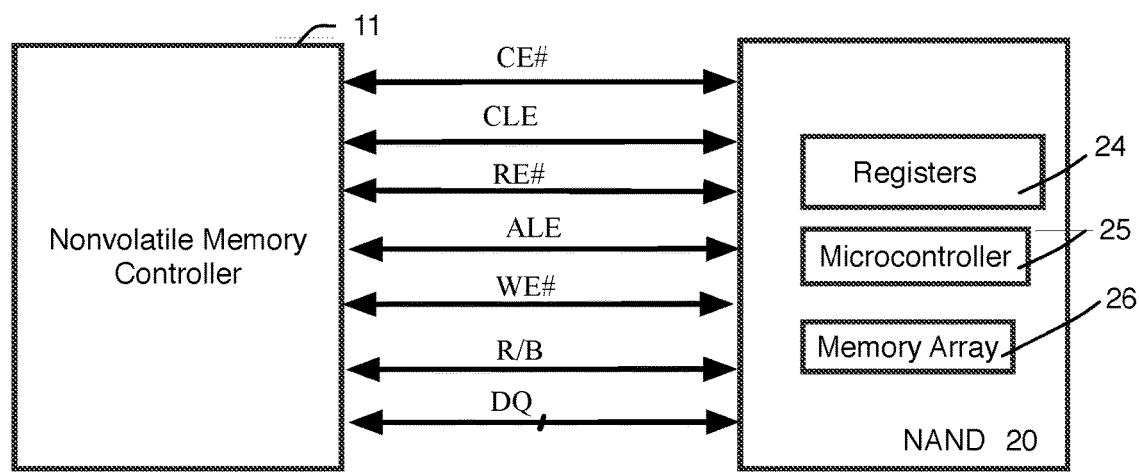
FIG. 2 is a diagram illustrating a nonvolatile memory controller and a nonvolatile memory device and illustrates the communication between the nonvolatile memory controller and the nonvolatile memory device in accordance with an embodiment of the present invention.

Each nonvolatile memory device 20 may be a packaged semiconductor die or "chip" that is coupled to nonvolatile memory controller 11 by conductive pathways that couple instructions, data and other information between each nonvolatile memory device 20 and nonvolatile memory controller 11. In the embodiment shown in FIG. 2 each nonvolatile memory device 20 includes registers 24, microcontroller 25 and memory array 26, and is coupled to nonvolatile memory controller 11 by a chip enable signal line (CE#), a command latch enable signal line (CLE), a read enable signal line (RE#), an address latch enable signal line (ALE), a write enable signal line (WE#), a read/busy signal line (R/B) and input and output signal lines (DQ). Upon receiving a write instruction from the host computer, write circuit 2 is operable to encode received data into a codeword that is sent to registers 24 along with a corresponding program instruction. Microcontroller 25 is operable to perform the requested NAND write instruction and store the codeword in memory array 26 by programming cells of memory array 26. In response to receiving a read instruction from the host computer, read circuit 9 is operable to send a read instruction to NAND 20. Microcontroller 25 reads the memory array 26 in response to the read instruction and outputs the read results at registers 24. The read results are sent to decoder 8 that is operable to decode the read results to obtain the stored codeword.

Figure 3:
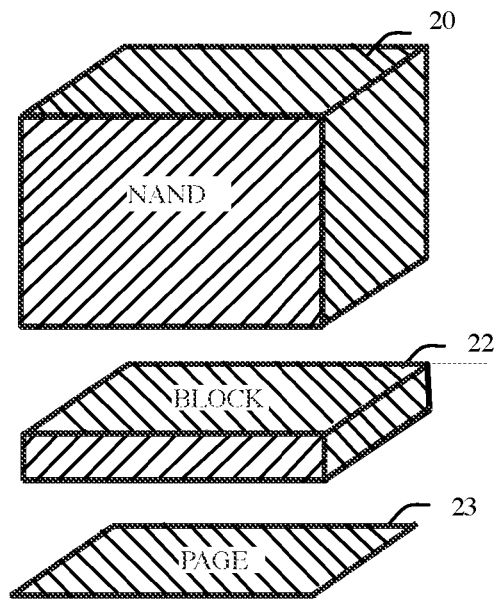
FIG. 3 is block diagram illustrating a memory logic organization in accordance with an embodiment of the present invention.

Referring now to FIG. 3, each nonvolatile memory device 20 includes NAND memory cells that are organized into blocks 22 and pages 23, with each block 22 composed of NAND strings that share the same group of word lines. Each logical page 23 is composed of cells belonging to the same word line. The number of logical pages 23 within logical block 22 is typically a multiple of 16 (e.g. 64, 128). In the present embodiment, a logical page 23 is the smallest addressable unit for reading from and writing to the NAND memory and a logical block 22 is the smallest erasable unit. However, it is appreciated that in embodiments of the present invention, programming to less than an entire page may be possible, depending on the structure of the NAND array.

Figure 4:
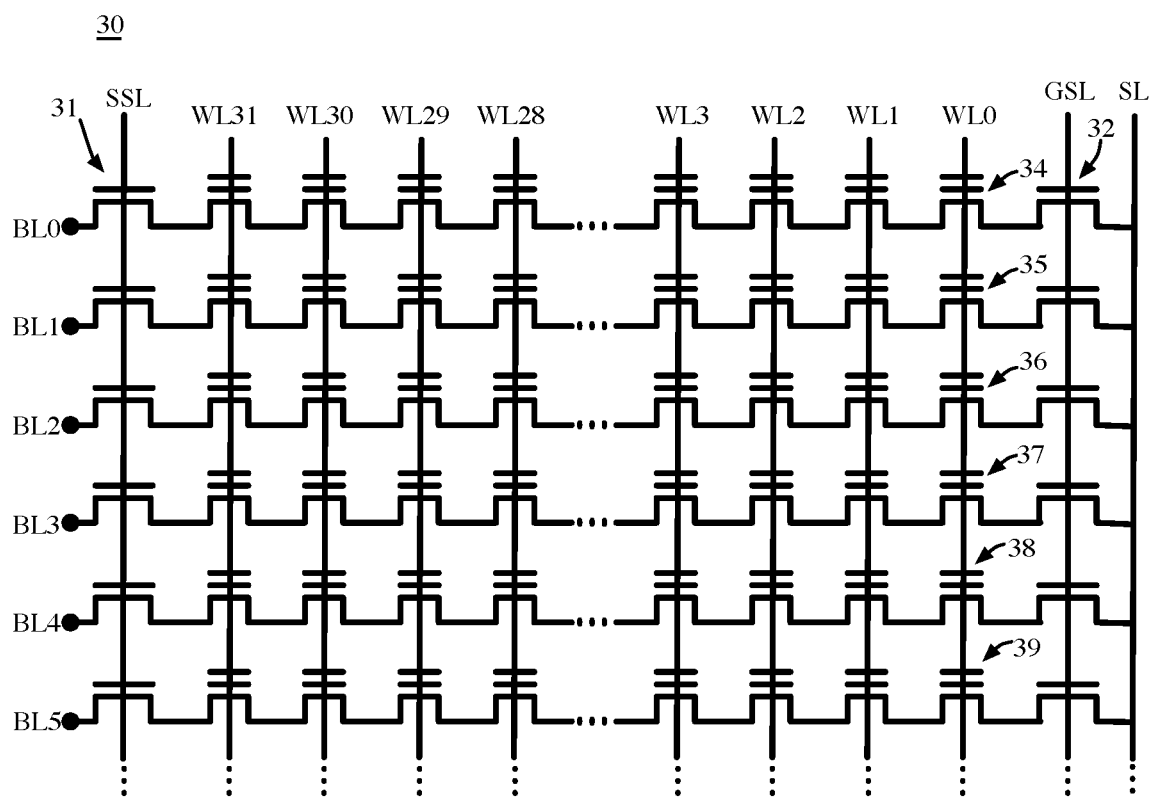
FIG. 4 is a diagram illustrating a NAND array in accordance with an embodiment of the present invention.

FIG. 4 shows an exemplary memory array 30 that is made of NAND memory cells connected in series to form NAND strings. Each NAND string is isolated from the rest of the array by select transistors such as, for example, select transistor 31 and select transistor 32. Multiple memory cells share the gate voltage (Vg) through a word line, and the drain of one memory cell is the source of the adjacent one. For example, memory cells 34-39 of FIG. 4 share word line 0 (WL0). Memory cells 34-39 may be single level cells that each store a single bit of information or NAND devices that store 2 bits per cell, 3 bits per cell or 4 bits per cell. The structure of the NAND array may be planar or 3D.

In the embodiment shown in FIG. 1 nonvolatile memory controller 11 includes a read circuit 9 that is configured to perform reads of the nonvolatile memory device 20. Standard read instructions (e.g., READ PAGE instruction), which may also be referred to as hard-read instructions, perform a read of a memory cell at a default threshold voltage within each threshold voltage region required to define a bit of the memory cell.

Threshold voltage shift reads are performed by sending a threshold voltage shift read instruction to a NAND device 20 that includes one or more read offset value that is to be used by the NAND device 20 in performing the read. Read offset values, which may also be referred to hereinafter as simply "offset values" or "offsets," indicate the amount by which the threshold voltage that is used to perform the read is to be offset from a corresponding default threshold voltage specified by the manufacturer of the NAND device 20. The term "default threshold voltage," as used in the present application is a threshold voltage established by the manufacturer of nonvolatile memory device 20 for performing a conventional read operation such as a READ instruction or a READ PAGE instruction. Typically this is identical with the threshold voltage of a threshold voltage shift read at an offset of 0. For MLC or TLC nonvolatile memory devices 20, there will be multiple default threshold voltages.

In the present embodiment NAND devices 20 are capable of performing a wide range of threshold voltage shift reads, including reads specified by whole number offset values such as −2, −1, 0, +1, +2, without limitation. For multi-level cell (MLC) NAND devices and triple level cell (TLC) NAND devices, reads are required at more than one threshold voltage to identify the value of a particular bit. Therefore, threshold voltage shift read instructions for MLC NAND or TLC NAND devices 20 will include two or more read offset values, one read offset value for each threshold voltage region required to identify the particular bit being read. In response to receiving a threshold voltage shift read instruction that includes the required read offset values, NAND device 20 is operable to perform reads at threshold voltages corresponding to the indicated read offset values to generate output that indicates the read results.

An erased block of a NAND 20 may be referred to as a "free block." When data is programmed into a block the block is referred to as an "open block" until all pages of the block have been programmed. Once all pages of the block have been programmed the block is referred to as a "closed block" until it is erased.

Nonvolatile memory controller 11 includes write circuit 2, memory storage 4, a status circuit 3 that is coupled to a read circuit 9, a background reference positioning (BRP) circuit 6 that is coupled to status circuit 3 and to read circuit 9, a decoder circuit 8 that is coupled to read circuit 9 and a Log Likelihood Ratio (LLR) circuit 7. LLR circuit 7 is coupled to BRP circuit 6, to read circuit 9 and to memory storage 4 and is operable to calculate LLR's that are used by decoder circuit 8 for decoding reads of nonvolatile memory devices 20. For clarity the various couplings are not shown.

Status circuit 3 is configured to determine usage characteristics of nonvolatile memory devices 20. The determined usage characteristics may be stored in memory storage 4 of nonvolatile memory controller 11. Alternatively, the determined usage characteristics can be stored in one or more nonvolatile memory devices 20 or in a separate volatile memory device 13. The term "usage characteristic" as used in the present invention is a value determined during usage of a nonvolatile memory device that indicates the historical usage of the nonvolatile memory device up to a particular point in time which may be, without limitation, the number of program and erase cycles or the bit error rate (BER) of a block or a group of blocks of a nonvolatile memory device 20.

Read circuit 9 is configured to perform background reads of at least one of the programmed codewords in a block of the nonvolatile memory devices at a default threshold voltage, at one or more threshold voltage offset that is less than the default threshold voltage and at one or more threshold voltage offset that is greater than the default threshold voltage. Decoder circuit 8 is configured to decode at least one of the background reads to identify at least one codeword. LLR circuit 7 is configured to identify a set of LLR values corresponding to the default threshold voltage using the read results and the identified codeword(s). Read circuit 9 is configured to perform host-requested reads of the nonvolatile memory devices and decoder circuit 8 is configured to decode the results of the host-requested reads using LLR values from the updated set of LLR values corresponding to the block that was read in the host-requested read.

Figure 5:
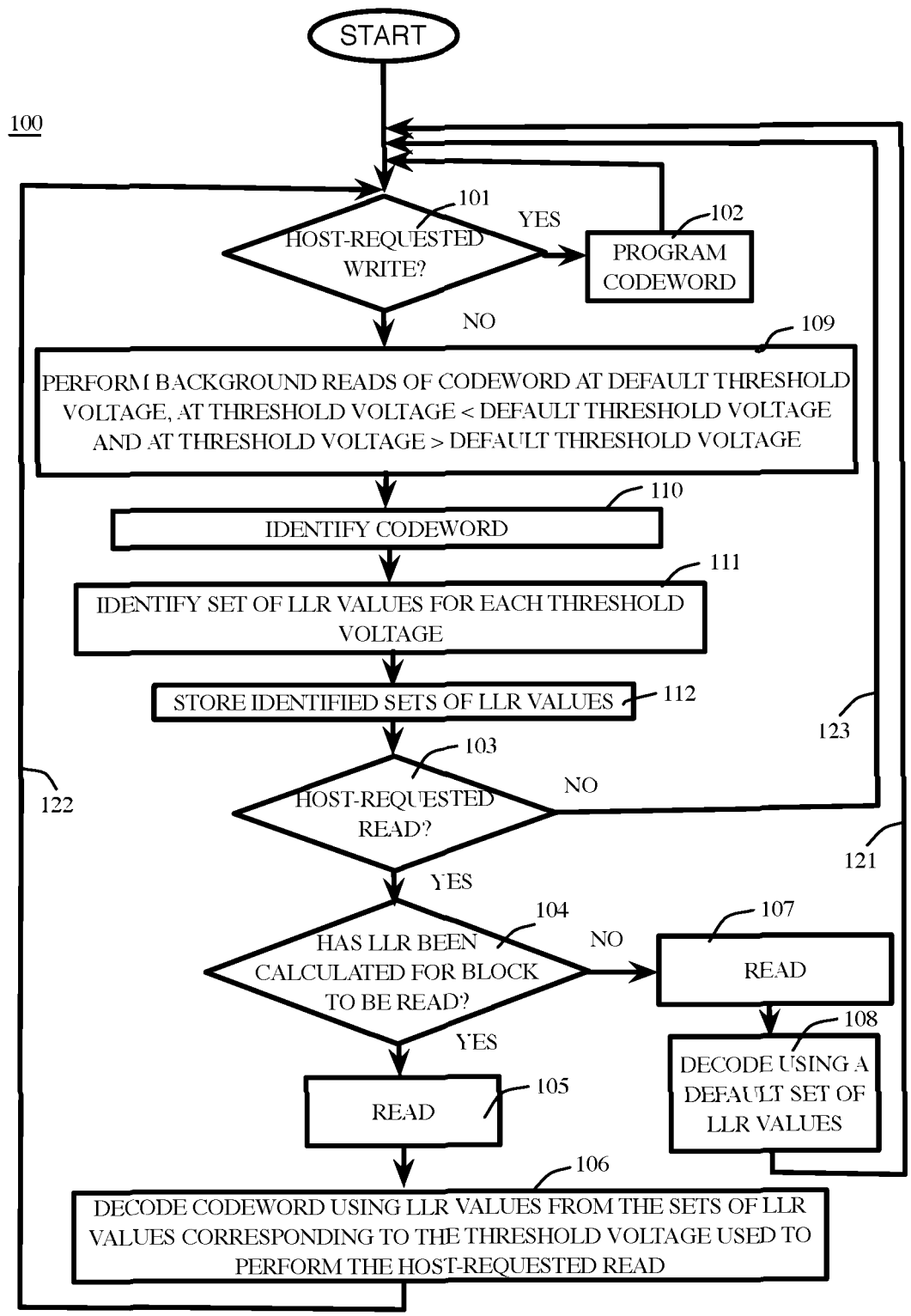
FIG. 5 is a flow diagram illustrating a method for calculating LLR and for reading nonvolatile memory devices and decoding the results of the reads in accordance with an embodiment of the present invention.

FIG. 5 illustrates a method 100 in accordance with an embodiment of the present invention. In response to host-requested write instructions, codewords are programmed into the nonvolatile memory devices 20 as shown by steps 101-102. In the embodiment shown in FIG. 1, write instructions are received from a host computer at host connector receptacle 12 that includes the user data. In response to receiving a write instruction, write circuit 2 is operable to issue a program instruction to a nonvolatile memory device 20 to program a codeword into the nonvolatile memory device 20 that includes the user data and ECC bits. Upon receiving the program instruction and the codeword at the nonvolatile memory device 20, microcontroller 25 is operable to store the codeword in memory array 26 (e.g., as a logical page).

A plurality of background reads of a codeword are performed 109. The term "background read," as used in the present invention, is any read performed in such a manner so as to not interfere with host-requested operations that are currently pending at nonvolatile memory controller 11 and the term specifically includes reads performed in such a manner so as to not delay pending host-requested reads (e.g., those reads that do not affect latency), and the term specifically includes reads that are assigned a priority that is less than the priority assigned to host-requested reads so that priority is given to any pending host-requested read (e.g., the pending host-requested read is performed first), and specifically includes reads performed at a time at which there are no pending host-requested reads. It is appreciated that host-requested write operations and host-requested erase operations can be stored by nonvolatile memory controller 11 and performed at a later time without affecting latency of SSD 1. Accordingly, in embodiments of the present invention, "background reads" are reads that are performed so as to not delay performance of host-requested reads, without consideration of pending host-requested write operations or pending host-requested erase operations unless storage of pending host-requested write operations or pending host-requested erase operations is near storage capacity.

In the present embodiment, once a codeword is identified to be read in step 109, a plurality of background reads are performed within each threshold voltage region that is required for reading the codeword, including a read at a default threshold voltage, a read at a threshold voltage offset that is less than the default threshold voltage, and a read at a threshold voltage offset that is greater than the default threshold voltage. The results of the background reads are then stored. The programmed codeword is identified using the background reads as shown by step 110. The codeword may be identified by decoding one of the background reads of step 109.

Figure 6A:
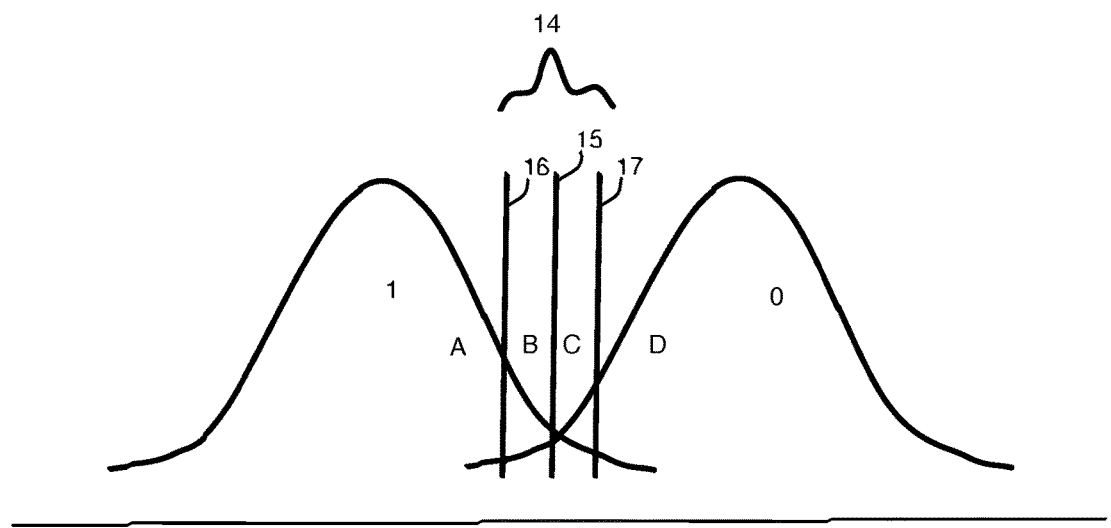
FIG. 6A is a diagram illustrating a voltage distribution and the calculation of LLR values for four regions of the voltage distribution in accordance with an embodiment of the present invention.

Referring now to FIG. 6A, Single Level Cell (SLC) nonvolatile memory devices only require a read in a single threshold voltage region 14, which extends between the center of the voltage distribution for a 1 and the center of the voltage distribution for a 0 to identify the value of a bit (whether the cell is storing a 1 or a 0). Nonvolatile memory controller 11 may perform a read at default threshold voltage 15 by sending a read command (e.g., READ PAGE) to the nonvolatile memory device 20 that is to be read along with the address of the codeword that is to be read. In one embodiment LLR circuit 7 is operable for communicating with read circuit 9, which generates and sends the READ PAGE (e.g., 00h-30h) instruction, receives the read results (which may be represented by the variable R) and stores the read results in temporary storage (e.g., in memory storage 4, in volatile memory 13 or in registers 92). Alternatively, the read at the default threshold voltage may be performed by using a threshold voltage shift read instruction (e.g., a SET FEATURES or Efh instruction) with a subfeature indicator (e.g., P1) that indicates read retry and a voltage offset of 0.

The read results are then sent to decoder circuit 8 that is operable to decode the read results to obtain the codeword that was initially stored. The decoded codeword (CW) is then stored in temporary storage (e.g., in memory storage 4, in volatile memory 13 or in registers 90).

In the embodiment shown in FIG. 6A, the one or more read at a threshold voltage that is less than the default threshold voltage is a read performed at an offset of −1, shown as default threshold voltage 16. The read may be performed by read circuit 9, which generates and sends the threshold voltage shift read instruction (e.g., a SET FEATURES or Efh instruction) with a subfeature indicator (e.g., P1) that indicates read retry and a voltage offset of −1, receives the read results R_N and stores the read results in temporary storage (e.g., in memory storage 4, in volatile memory 13 or in registers 91).

In the embodiment shown in FIG. 6A, the one or more read at a threshold voltage that is greater than the default threshold voltage is a read performed at an offset of +1, shown as default threshold voltage 17. The read may be performed by read circuit 9, which generates and sends the threshold voltage shift read instruction (e.g., a SET FEATURES or Efh instruction) with a subfeature indicator (e.g., P1) that indicates read retry and a voltage offset of +1, receives the read results R_P and stores the read results in temporary storage (e.g., in memory storage 4, in volatile memory 13 or in registers 93).

A set of LLR values is identified 111 for each default threshold voltage using the stored read results and the identified CW. The identified set of LLR values is then stored 112. In the example shown in FIG. 6A, the errors identified in reads 15-17 are used to identify a LLR for each of regions A, B, C and D that are centered around default threshold voltage 15.

Figure 7:
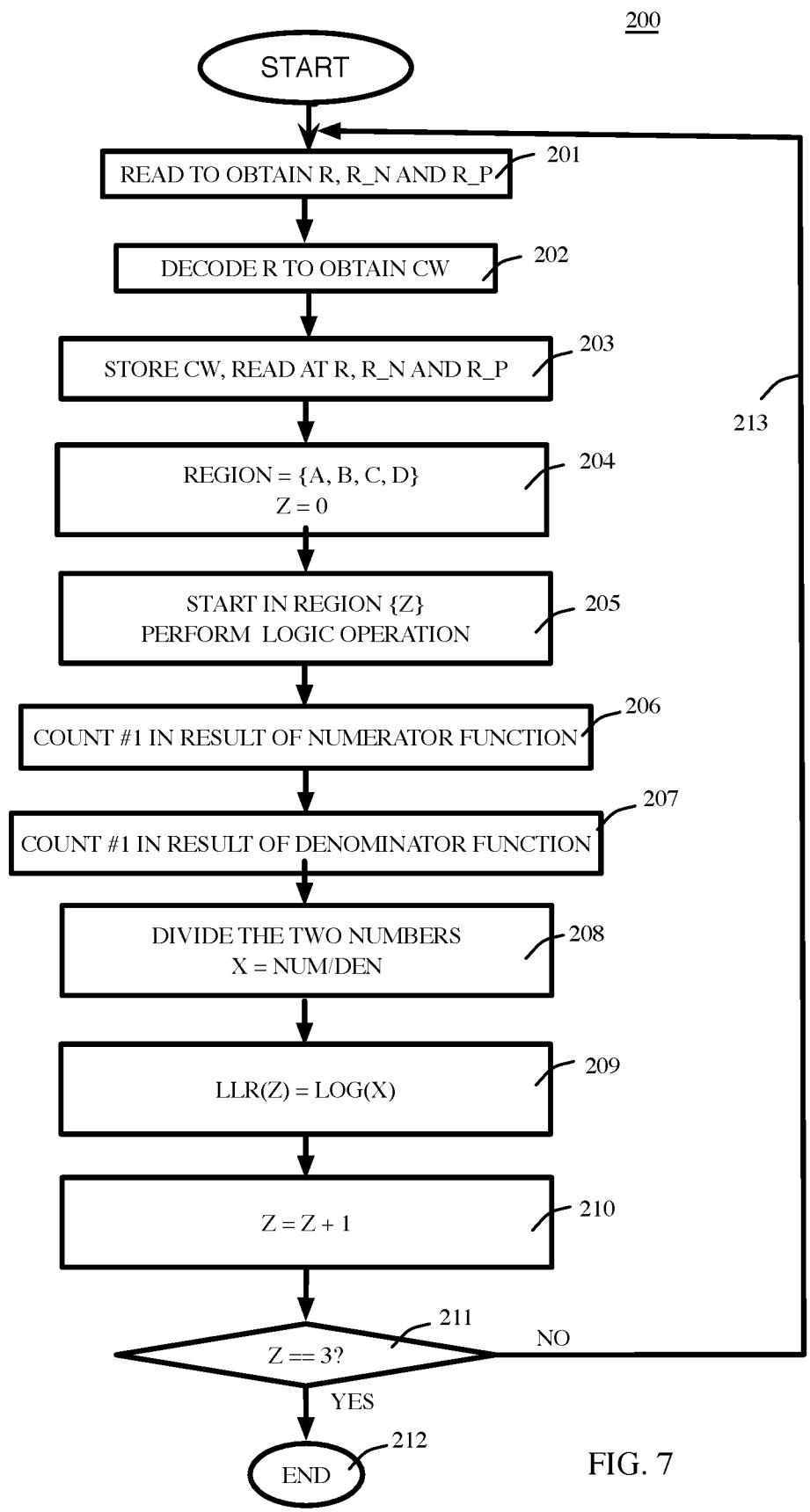
FIG. 7 is a flow diagram illustrating calculation of LLR for four regions of a voltage distribution in accordance with an embodiment of the invention.

FIG. 7 shows a method 200 for performing steps 109-112 for the SLC NAND distribution shown in FIG. 6A. In step 109 threshold voltage region 14 is read at default threshold voltage 15 to obtain read results R, at threshold voltage 16 to obtain read results R_N and at threshold voltage 17 to obtain read results R_P. R is decoded 202 to obtain the stored codeword CW. Though R is decoded to obtain CW, it is appreciated that alternatively either R_N or R_P could have been decoded to obtain CW. CW, R_N, R and R_P are stored 203. A region Z is selected 204, which may be, for example, one of regions A, B, C and D shown in FIG. 6A, and a logic operation for the selected region is performed 205. In the present embodiment, the logic operation includes performing a numerator function to obtain numerator bit values and performing a denominator function to obtain denominator bit values. The number of 1's in the numerator bit values is counted 206 to obtain the numerator value NUM and the number of 1's in the denominator bit values is counted 207 to obtain the denominator value DEN. The two numbers are divided 208 to identify the result X and the logarithm of the result X is calculated to be the LLR for the region. This process is repeated as shown by step 211 and line 213 until LLR values have been calculated for each region.

Following is an example in which the LLR for region A (LLR_A) is calculated using the equation:

$$\text{LLR\_A} = \log \frac{\text{count of bits} == 1 \text{ in (NOT } (CW) \text{ AND } R_N)}{\text{count of bits} == 1 \text{ in } (CW \text{ AND } R_N)}$$

which may be calculated using a logic function, where ~ indicates bitwise NOT and where & indicates bitwise AND, and in which the numerator bit values=(~(CW) & R_N) and the denominator bit values=(CW & R_N). A count of bits having a value of 1 in the calculated numerator bit values, shown as step 206, gives a numerical value that may be represented by the logic: NUM=count (~(CW) & R_N). A count of bits having a value of 1 in the calculated denominator bit values, shown as step 207, gives a numerical value that may be represented by the logic: DEN=count (CW & R_N). As shown by step 208 the count of step 206 is divided by the count of step 207. The log of the results of the division of step 208 is calculated as shown by step 209.

As shown by steps 210, 211, 213 Z is incremented and the process is repeated to calculate the LLR for region B LLR_B using the equation:

$$LLR\_B = \log \frac{\text{count of bits} == 1 \text{ in (NOT } (CW) \text{ AND } R \text{ AND NOT } (R_N))}{\text{count of bits} == 1 \text{ in } (CW \text{ AND } R \text{ AND NOT } (R_N))}$$

which may be calculated using a logic function in which the numerator N=count (~(CW) & R & ~(R_N)) and the denominator DEN=count (CW & R & ~(R_N)).

The LLR for region C LLR_C may be calculated using the equation:

$$LLR\_C = \log \frac{\text{count of bits} == 1 \text{ in (NOT } (CW) \text{ AND NOT } (R) \text{ AND } R_P)}{\text{count of bits} == 1 \text{ in } (CW \text{ AND NOT } (R) \text{ AND } R_P)}$$

which may be calculated using a logic function in which the numerator NUM=count (~(CW) & ~(R) & R_P) and the denominator DEN=count (CW & ~(R) & R_P).

As shown by steps 210, 211, 213 Z is incremented and the LLR for region D LLR_D may be calculated using the equation:

$$LLR\_D = \log \frac{\text{count of bits} == 1 \text{ in (NOT } (CW) \text{ AND NOT } (R_P))}{\text{count of bits} == 1 \text{ in } (CW \text{ AND NOT } (R_P))}$$

which may be calculated using the logic function: NUM=count (~(CW) & ~(R_P)) and DEN=count (CW & ~(R_P)). At step 211 Z=3, indicating that all LLR values have been calculated so the process ends 212.

Figure 8:
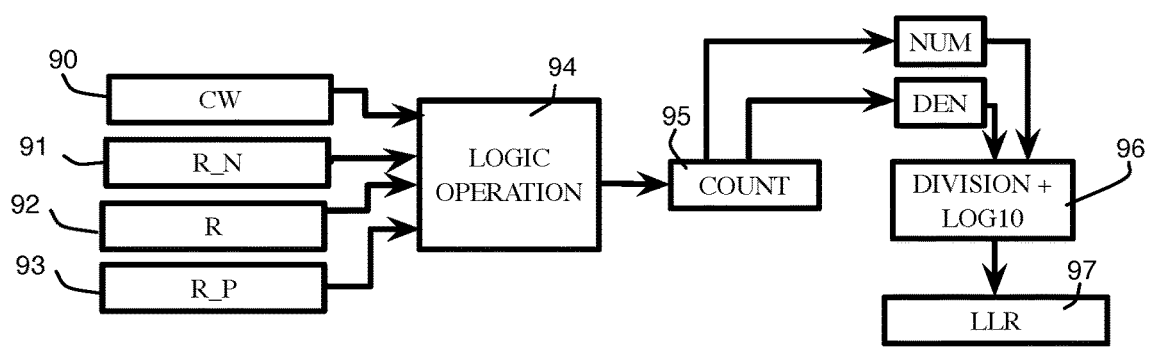
FIG. 8 is a diagram illustrating portions of a LLR circuit in accordance with an embodiment of the present invention.

In one embodiment that is illustrated in FIG. 8, memory storage 4 includes logic for storing CW, R, R_N and R_P, shown as registers 90-93. Registers 90-93 are coupled to LLR logic 94 for performing the logic operations of step 205 and one or more counter 95 for counting the number of 1's in the output from the LLR logic operations performed by LLR logic 94. Counter 95 is coupled to division and log logic 96 that is operable to perform steps 208-209 to obtain LLR values 97 that may be stored in LLR table 10 of FIG. 1.

Following is an exemplary calculation of LLR_A in which the read at the default threshold voltage 15 produces read results R, a codeword CW, R_N and R_P.

CW=00010101011111000
R=00110101111110000
R_N=00110101111110110
R_P=00110101100010000.

In this example, the numerator bit values=(~(CW) & R_N)=00100000100000110 and the count of 1's in the numerator bit values NUM=4. The denominator bit values=(W & R_N)=00010101011111000 and the count of 1's in the denominator bit values DEN=8, giving a LLR_A=log (4/8).

In embodiments of the present invention more than one codeword is read in step 109 of FIG. 5 and is used to calculate LLR in steps 110-111. In this embodiment, several exemplary pages of each page group are read in step 109 and the read results and a plurality of codewords CW are identified and stored. After errors are identified for reads of each of the codewords, the errors are combined to calculate LLR values. In the above example for calculating four LLR regions using R_N, R, R_P, numerator bit values are calculated for each region and the count of 1's in each of the numerator bit values is determined, and the count of 1's for each of the representative pages is summed to obtain a numerator error sum. Similarly, the denominator bit values are calculated for each region and the count of 1's in each of the denominator bit values is determined, and the count of 1's for each of the representative pages is summed to obtain a denominator error sum. The resulting LLR equation will include a numerator value N and a denominator value DEN for each of the N pages that are read. Thus, for the first page that is read $NUM_1$ and $DEN_1$ will be calculated, for the second exemplary page that is read $NUM_2$ and $DEN_2$ will be calculated, and the process continues until all N pages have been read, giving $NUM_1$, $NUM_2$ . . . $NUM_N$ and $DEN_1$, $DEN_2$ . . . $DEN_N$. The LLR for each region will be $LLR=\log_{10}(NUM_1+NUM_2 \ldots +NUM_N/DEN_1+DEN_2 \ldots +DEN_N)$. The greater the number of exemplary pages used to calculate LLR for each page group, the higher the accuracy of the resulting LLR values. However, as the number of pages increases, the time required to perform steps 109-112 increases. It has been found that the use of three exemplary pages (N=3) of each page group gives good results.

In embodiments of the present invention blocks are divided into logical pages and a logical page is the smallest amount of data that can be programmed. In this embodiment, each codeword is a logical page or a part of it. Accordingly, the set of LLR values used to decode each read of a page will be the set of LLR values for the block that includes the page being read. In particular, step 109 will perform background reads of one or more representative page of each block and steps 110-111 will identify a set of LLR values for each default threshold voltage region required to read the representative pages of the block.

In one exemplary embodiment in which SSD 1 includes 128 nonvolatile memory devices 20, each of which includes 2048 blocks, blocks may be assigned block numbers 0 through 262,143. In this embodiment, LLR table 10 may include block numbers and a set of LLR values corresponding to each block number, with the LLR values to be used in decoding determined by indexing the LLR table with the block number of the page that is being decoded.

The steps of performing background reads 109 and storing the results, decoding of at least one of the background reads to identify a codeword 110, and the identifying a set of LLR values 111 are continued in order to identify a set of LLR values for each block of the nonvolatile memory devices. The identified sets of LLR values may be stored 112 in LLR table 10 along with the corresponding block number. Accordingly, in the embodiment in which SSD 1 includes 128 nonvolatile memory devices 20, each of which includes 2048 blocks, the table includes 262,144 sets of LLR values and corresponding block number indexes from 0 to 262,143.

The process of steps 109-112 continues throughout the lifetime of SSD 1, identifying updated sets of LLR values. As each updated set of LLR values is identified it is stored in LLR table 10 by overwriting any previously stored corresponding set of LLR values. For example, when an updated set of LLR values is identified for a particular block, the previously determined set of LLR values for that block that was stored in LLR table 10 is overwritten by the updated set of LLR values. Accordingly, LLR table 10 will always include the most recently determined set of LLR values for each block.

In one embodiment, steps 109-112 are only performed on blocks that are closed (while the blocks are closed). In another embodiment steps 109-112 are only performed on blocks that are closed and only on the occurrence of one or more of an endurance event, a retention timer event and a read disturb event. Thereby, background reads are performed frequently enough to maintain accurate sets of LLR values for each block, but not so often as to negatively impact latency of the SSD 1.

In an embodiment of the present invention, when SSD 1 is assembled and operation of SSD 1 is first initiated, no LLR table is stored in SSD 1. In this embodiment, nonvolatile memory controller 11 is operable to identify the characteristics of each nonvolatile memory device 20 that it is coupled to and is operable to determine, in an automated fashion (without any user input) the number of blocks on each nonvolatile memory device 20, and is operable to assign a unique number to each block (block number). The process of steps 109-112 is also performed in an automated manner (without user input) after assembly of SSD 1, during operation of SSD 1 by a user of SSD 1, to create and update a single LLR table 10. In this embodiment, the values in LLR table 10 are calculated after assembly of SSD 1, after the first initialization of SSD 1, and LLR table 10 is constructed in its entirety after the first initialization of SSD 1, which may be after SSD 1 has been shipped to a user of SSD 1.

When no host-requested reads are pending 103, 123, normal operation of the nonvolatile memory device is continued, with steps 109-112 performed in the background so as not to affect the latency of nonvolatile memory system 1. When a host-requested read instruction is received and a LLR has been calculated for the block to be read, the host-requested read is performed 105. The host-requested read may be performed using a threshold voltage shift read instruction at different offset values to obtain the hard-read results and soft information. The term "soft information," as used in the present application, is information indicating the results of one or more reads at a threshold voltage less than the default threshold voltage and one or more reads at a threshold voltage greater than the default threshold voltage. In the present embodiment step 105 is performed by read circuit 9. The results of the host-requested read are decoded 106 using LLR values from the updated set of LLR values corresponding to the block that was read in the host-requested read. Accordingly, when nonvolatile memory devices are SLC devices, each codeword is decoded using LLR values from the sets of LLR values corresponding to the default threshold voltage used to perform the host-requested read. In the present embodiment step 106 is performed by decoder circuit 8, which will use the most recently determined set of LLR values in LLR table 10 to perform the decoding (i.e., either the initial set of LLR values calculated for the block that was read or the most recently updated set of LLR values for the block that was read).

During the early life of SSD 1, reads may be required for a codeword for which the LLR has not yet been calculated 104, 107. In that event, the read is performed using a conventional read instruction such as a READ PAGE instruction (a hard read) and decoding is performed using a default set of LLR values. Since this will only be required during early in the lifetime of the SSD 1, reads at the default threshold voltage are not likely to result in read errors, even when inaccurate LLR values are used. It has been found that, during this period, as long as LLR values that are close to 0 are not used, decoding is successful. In one embodiment, for LLR regions to the left of the default threshold voltage any negative number from −6 to −15 can be used to perform decoding and for LLR regions to the right of the default threshold voltage any positive number from +6 to +15 can be used to perform decoding. In one exemplary embodiment in which 2 LLR regions are used, in step 108 the default set of LLR values is LLR_A=−6, LLR_B=+6.

Alternatively, a threshold voltage shift read can be used to perform the read of step 107 to obtain the hard-read results and soft information. In an embodiment in which 4 LLR regions are used, in step 108 the default set of LLR values is LLR_A=−6, LLR_B=−6, LLR_C=+6 and LLR_D=+6. In this embodiment, all host-requested reads are performed using a threshold voltage shift read instruction. Thereby, specialized logic is not required for determining whether a LLR has been calculated for the block of the page that is being read.

Accordingly, in an embodiment in which nonvolatile memory device system 1 includes 128 SLC nonvolatile memory devices and 2048 blocks per nonvolatile memory device, system 1 will include 262,144 (128×2048) sets of LLR values. In the embodiment of FIG. 6A each set of LLR values will contain four LLR values, requiring the storage of 1,048,576 (128×2048×4) LLR values (when blocks are not grouped into block groups as will be subsequently described).

Figure 6B:
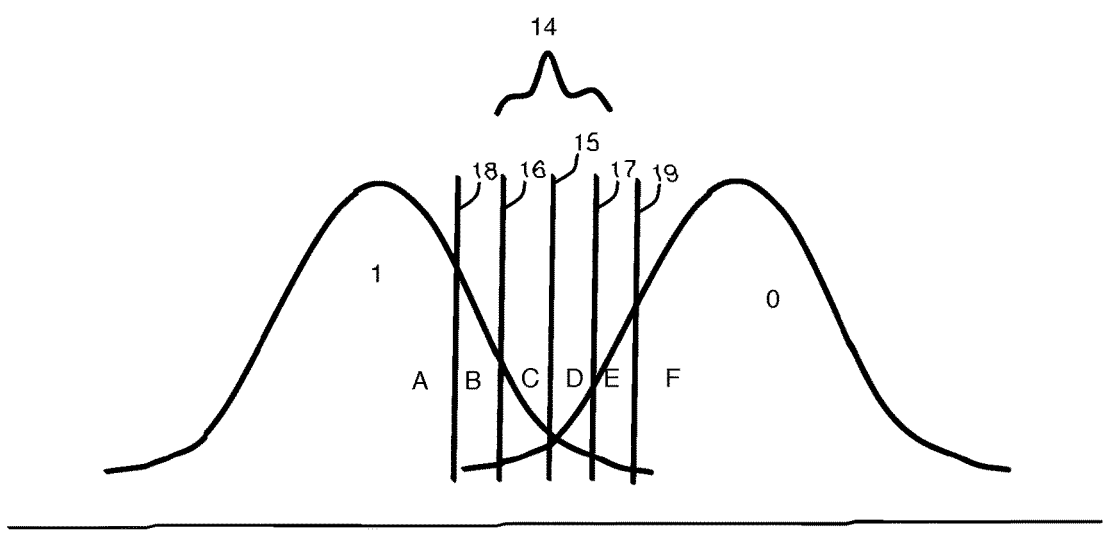
FIG. 6B is a diagram illustrating a voltage distribution and the calculation of LLR values for six regions of the voltage distribution in accordance with an embodiment of the present invention.

Method 100 calculates sets of LLR values during the life of each nonvolatile memory device 20, these sets of LLR values being specific to the nonvolatile memory device itself, and the sets of LLR values are continually updated during the entire lifespan of the nonvolatile memory device 20. Therefore, an accurate set of LLR values is always available for use in decoding. In addition, because a set of LLR values is calculated and repeatedly updated for each block and is used for decoding codewords stored in that particular block, variations between the error characteristics of the different blocks are taken into account during the entire lifetime of the nonvolatile memory system, giving superior uncorrectable bit error rate (UBER) than is obtained using prior art methods. In addition, by calculating LLR values during the operation of the nonvolatile memory device 20, and after the nonvolatile memory controller 11 has been sold to a customer and integrated into a nonvolatile memory system 1, the need for testing test chips similar to nonvolatile memory devices 20 in a test lab to generate LLR tables for different periods of the lifetime of the nonvolatile memory devices 20 is avoided, and the need to store pre-generated LLR tables for different periods of the lifetime of the SSD 1 on the nonvolatile memory system is avoided. Though the above embodiments calculated LLR values for only four regions it is appreciated that LLR values could be calculated for more regions. In the example shown in FIG. 6B, LLR values are calculated for six regions centered around each default threshold voltage 15, shown as regions A-F. In this embodiment reads at two threshold voltages that are less than the hard-read threshold voltage, shown as threshold voltages 18, 16, that may have read offset values of −2, −1, are used, as well as reads at two threshold voltages that are greater than the default threshold voltage, shown as threshold voltages 17, 19, that may have read offset values of +1, +2. Accordingly, in an embodiment in which nonvolatile memory system 1 includes 128 SLC nonvolatile memory devices, and 2048 blocks per nonvolatile memory device, each set of LLR values will contain six LLR values, requiring the storage of 1,572,864 (128×2048×6) LLR values (when blocks are not grouped into block groups as will be subsequently described).

In one alternate embodiment in which all host-requested reads 105, 107 are performed using a threshold voltage shift read instruction to obtain soft information, after initialization of SSD 1 a LLR table 10 is automatically generated in which all LLR values are set to an identical default set of LLR values. In an embodiment in which 4 LLR regions are used, the default set of LLR values for each block is LLR_A=−6, LLR_B=−6, LLR_C=+6 and LLR_D=+6. In an embodiment in which 6 LLR regions are used, the default set of LLR values for each block is LLR_A=−6, LLR_B=−6, LLR_C=−6, LLR_D=+6, LLR_E=+6 and LLR_F=+6. These initial LLR values are then updated during the lifetime of SSD 1 using method 100.

Multi-Level Cell (MLC) and Triple-Level Cell (TLC) nonvolatile memory devices 20 require reads at more than one threshold voltage region to identify the value of a bit. When nonvolatile memory devices 20 are MLC or TLC devices, in step 109 background reads of representative pages of a block are performed at a default threshold voltage within each threshold voltage region required to read the representative pages, at one or more threshold voltage offset that is less than the default threshold voltage within each threshold voltage region required to read the representative pages and at one or more threshold voltage offset that is greater than the default threshold voltage within each threshold voltage region required to read the representative pages. In this embodiment, in step 111, a set of LLR values corresponding to each threshold voltage region required to read the representative pages is identified using the stored read results and the identified codeword(s). The process of steps 109-111 is continued to identify a set of LLR values corresponding to each threshold voltage region required to read the representative pages of each block (e.g., to create an initial LLR table 10), and the process of steps 109-112 is continued throughout the lifetime of SSD 1 to identify an updated set of LLR values corresponding to each threshold voltage region required to read the representative pages. Host-requested reads are performed 105 using the most recent updated set of LLR values corresponding to the block that was read in the host-requested read.

Figure 9A:
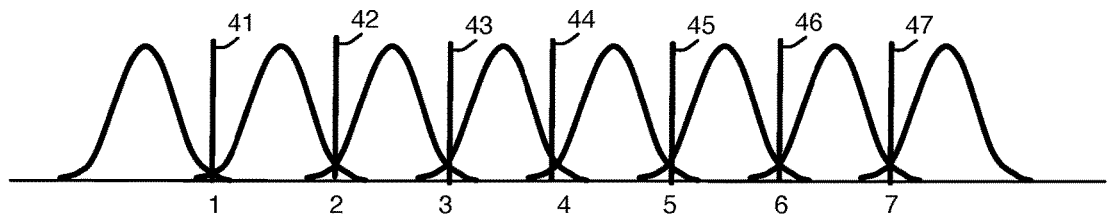
FIG. 9A is a diagram illustrating voltage distribution and default threshold voltages for a TLC NAND device in accordance with an embodiment of the present invention.
Figure 9B:
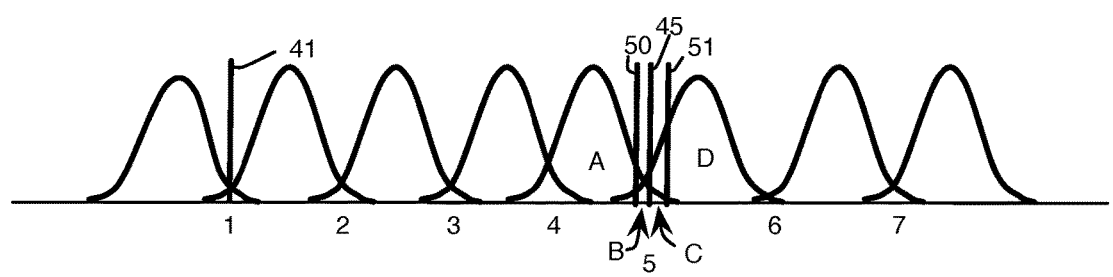
FIG. 9B is a diagram illustrating calculation of LLR for a TLC NAND device in accordance with an embodiment of the present invention.
Figure 9C:
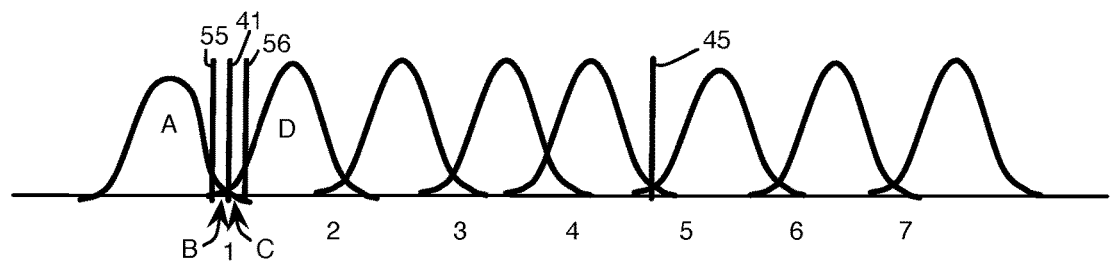
FIG. 9C is a diagram illustrating calculation of LLR for a TLC NAND device in accordance with an embodiment of the present invention.

In the exemplary embodiment shown in FIG. 9A, nonvolatile memory devices 20 are TLC NAND devices that require reads in each of threshold voltage regions 1-7 to identify the value of the stored bits. The manufacturer specified default threshold voltages for reading threshold voltage regions 1-7 are shown as default threshold voltages 41-47. FIGS. 9B-9C illustrate performing method 100 for an exemplary TLC NAND device 20 in which lower page bits are defined by reads at threshold voltage regions 1 and 5 (default threshold voltages 41 and 45), upper page bits are defined by reads at threshold voltage regions 3 and 7 (default threshold voltages 43 and 47), and middle page bits are defined by reads at threshold voltage regions 2, 4 and 6 (default threshold voltages 42, 44 and 46).

FIG. 9B-9C illustrate background reads of a lower page, with reads performed at one threshold voltage that is less than the default threshold voltage, at the default threshold voltage, and one threshold voltage that is more than the central threshold voltage so as to allow for calculation of four LLR values (e.g., LLR values for regions A-D). Since lower page reads require reads in threshold voltage regions 1 and 5, each threshold voltage shift read instruction for a lower page will include two threshold voltage offsets, and the threshold voltage shift read instruction may be represented as TVSR ($V_{O1}$, $V_{O5}$), where "$V_{O1}$" is the threshold voltage offset for reading region 1 and "$V_{O5}$" is the threshold voltage offset for reading region 5.

In the present example, the default threshold voltage for region 1 and the default threshold voltage for region 5 are the default threshold voltages for regions 1 and 5 corresponding to a threshold voltage offset of 0. Threshold voltage region 5 is selected first for calculating LLR values. In the example shown in FIG. 9B, in step 109 three background reads are performed: a first background read TVSR (0, −1) at an offset of 0 for region 1 and an offset of −1 for region 5, shown as threshold voltages 41, 50 to obtain read results R_5N, a second background read TVSR (0, 0) at an offset of 0 for region 1 and an offset of 0 for region 5, shown as threshold voltages 41, 45 to obtain read results R_5 and a third background read at TVSR (0, +1) at an offset of 0 for region 1 and an offset of +1 for region 5, shown as threshold voltages 41, 51, to obtain read results R_5P. As each of the read results R_5N, R_5, R_5P are received at nonvolatile memory controller 11, the read results are stored in temporary storage. One of the read results R_5N, R_5, R_5P is sent to decoder circuit 8 for decoding to obtain the codeword CW. Steps 110-112 are performed to obtain a set of LLR values for threshold voltage region 5, which may be represented in the form LLR_5A, LLR_5B, LLR_5C, LLR_5D.

Referring now to FIG. 9C, the process is repeated to obtain LLR's for threshold voltage region 1, while keeping the value of threshold voltage region 5 at the default threshold voltage. Three exemplary page reads are performed: a first background read TVSR (−1, 0) at an offset of −1 for region 1 and an offset of 0 for region 5, shown as threshold voltages 55, 45 to obtain read results R_1N, a second background read TVSR (0, 0) at an offset of 0 for region 1 and an offset of 0 for region 5, shown as threshold voltages 41, 45 to obtain read results R_1 and a third background read TVSR (+1, 0) at an offset of +1 for region 1 and an offset of 0 for region 5, shown as threshold voltages 56, 45, to obtain read results R_1P. As each of the read results R_1N, R_1, R_1P are received at nonvolatile memory controller 11, the read results are stored in temporary storage. Steps 110-112 are performed using codeword CW that was obtained in the calculation of LLR values for region 5 to obtain a set of LLR values for threshold voltage region 1, which may be represented in the form LLR_1A, LLR_1B, LLR_1C, LLR_1D.

The following are exemplary equations that may be used for calculating 4-region LLR values for a lower page of a TLC NAND for region 1:

LLR_1A=log [count bits==1 in (NOT(CW) AND BRP_N AND Upper-Coupled Bits)/count bits==1 in (CW AND BRP_N AND Upper-Coupled Bits)]

LLR_1B=log [count bits==1 in (NOT(CW) AND BRP AND NOT(BRP_N) AND Upper-Coupled Bits)/count bits==1 in (CW AND BRP AND NOT(BRP_N) AND Upper-Coupled Bits)]

LLR_1C=log [count bits==1 in (NOT(CW) AND NOT (BRP) AND BRP_P AND Upper-Coupled Bits)/count bits==1 in (CW AND NOT(BRP) AND BRP_P AND Upper-Coupled Bits)]

LLR_1D=log [count bits==1 in (NOT(CW) AND NOT (BRP_P) AND Upper-Coupled Bits)/count bits==1 in (CW AND NOT(BRP_P) AND Upper-Coupled Bits)].

Following are exemplary equations that may be used for calculating LLR for a lower page of a TLC NAND for region 5:

LLR_5A=log [count bits==1 in (NOT(CW) AND BRP_N AND NOT(Upper-Coupled Bits))/count bits==1 in (CW AND BRP_N AND NOT(Upper-Coupled Bits))].

LLR_5B=log [count bits==1 in (NOT(CW) AND BRP AND NOT(BRP_N) AND NOT(Upper-Coupled Bits))/count bits==1 in (CW AND BRP AND NOT (BRP_N) AND NOT(Upper-Coupled Bits))].

LLR_5C=log [count bits==1 in (NOT(CW) AND NOT (BRP) AND BRP_P AND NOT(Upper-Coupled Bits))/count bits==1 in (CW AND NOT(BRP) AND BRP_P AND NOT(Upper-Coupled Bits))].

LLR_5D=log [count bits==1 in (NOT(CW) AND NOT (BRP_P) AND NOT(Upper-Coupled Bits))/count bits==1 in (CW AND NOT(BRP_P) AND NOT(Upper-Coupled Bits))].

In the above example, a single set of LLR values is obtained and updated for each block and is stored along with the block number of the exemplary page that was used to calculate LLR values.

Though maintaining an updated set of LLR values for each block using method 100 provides superior UBER as compared to conventional methods, it has been found that there is often variation in BER within blocks, with certain pages of each block having common BER characteristics. Accordingly, in embodiments of the present invention pages of each block are divided into page groups, with the pages within each page group having similar BER characteristics.

In one embodiment, each block 22 of each nonvolatile memory device 20 is divided into page groups that include pages having similar error characteristics. The LLR table 10 may include an index that identifies each page group, which may be, for example a numerical value from 1 to 3,145,728 (128×2048×12), which will identify both the page group and the block and the nonvolatile memory device 20 (since all page groups within all nonvolatile memory devices 20 of SSD 1 will have a unique index). The page group index is stored in LLR table 10 along with the corresponding LLR values for each voltage region required to read the pages of the page group. When the nonvolatile memory devices 20 are SLC devices, step 109 includes performing background reads of representative pages of a page group at a default threshold voltage, at one or more threshold voltage offset that is less than the default threshold voltage and at one or more threshold voltage offset that is greater than the default threshold voltage. In step 110 one or more codeword is identified 110 and step 111 is performed by identifying a set of LLR values for each page group using the read results and the codeword(s) identified in step 110. In step 106, the results of the host-requested reads are decoded using LLR values from the set of updated LLR values corresponding to the page group of the page that was read. In this embodiment method 100 may include generating LLR table 10 and storing 112 each of the identified sets of LLR values in LLR table 10 along with an index identifying the corresponding page group. Each time that an updated set of LLR values is identified in step 111, the updated set of LLR values is stored in LLR table 10 by overwriting the corresponding set of LLR values previously stored in the LLR table. Thus, the decoding of step 106 may include indexing the LLR table using an index value corresponding to the page group of the page that was read.

When nonvolatile memory devices 20 are MLC or TLC devices, page groups may be identified by splitting wordlines into topological types (upper pages, middle pages and lower pages) and in categories according to their topological behavior, i.e. error characteristics vs physical position inside the block. In the present embodiment, topological behavior is categorized by assigning different wordlines to different categories. Categories may be determined in a flash lab during a characterization phase where topological position vs error behavior is studied. In one illustrative embodiment wordlines are grouped into the following categories:

First: wordline 0 to wordline 24.
Second: wordline 25 to wordline 84.
Third: wordline 85 to wordline 119.
Fourth: wordline 120 to wordline 127.

It can be seen that different wordline groups do not necessarily include the same number of wordlines or the same number of memory cells. In the present embodiment wordline groups are determined by analyzing the characteristics of NAND devices in a lab to identify groupings that have similar error behavior. In the present illustrative embodiment, nonvolatile memory devices 20 are TLC NAND devices in which each memory cell can store three different bits of information. Since there are three page types in a TLC NAND device, this gives the following page groups:

Page Group 1: upper pages of wordlines 0-24.
Page Group 2: middle pages of wordlines 0-24.
Page Group 3: lower pages of wordlines 0-24.
Page Group 4: upper pages of wordlines 25-84.
Page Group 5: middle pages of wordlines 25-84.
Page Group 6: lower pages of wordlines 25-84.
Page Group 7: upper pages of wordlines 85-119.
Page Group 8: middle pages of wordlines 85-119.
Page Group 9: lower pages of wordlines 85-119.
Page Group 10: upper pages of wordlines 120-127.
Page Group 11: middle pages of wordlines 120-127.
Page Group 12: lower pages of wordlines 120-127.

Accordingly, in an embodiment in which nonvolatile memory device system 1 includes 128 nonvolatile memory devices and 2048 blocks per nonvolatile memory device, system 1 will include 3,145,728 (128×2048×12) page groups (when blocks are not grouped into block groups as will be subsequently described).

When nonvolatile memory devices 20 are MLC or TLC devices, in step 109 background reads of representative pages of a page group are performed at a default threshold voltage within each threshold voltage region required to read the representative pages, at one or more threshold voltage offset that is less than the default threshold voltage within each threshold voltage region required to read the representative pages and at one or more threshold voltage offset that is greater than the default threshold voltage within each threshold voltage region required to read the representative pages. In this embodiment, in step 111, a set of LLR values corresponding to each threshold voltage region required to read the representative pages is identified using the stored read results and the identified codeword(s). The process of steps 109-112 is repeated to identify a set of LLR values corresponding to each threshold voltage region required to read the representative pages of each page group (e.g., to create a complete initial LLR table 10), and the process of steps 109-112 is continued throughout the lifetime of SSD 1 to identify updated sets of LLR values corresponding to each threshold voltage region required to read the representative pages. Host-requested reads are performed 105 using the most recent updated set of LLR values corresponding to the page group of the page that was read in the host-requested read.

In one embodiment, for MLC and TLC nonvolatile memory devices, the LLR values for each voltage region required to read a page of the page group are concatenated and stored in the LLR table so that each of the sets of concatenated LLR values is associated with a single page group index. In step 106 each codeword is decoded using LLR values from the sets of LLR values corresponding to the page group of the page being read. For example, if a page within the first page group of the second block is being read and decoded that requires reads in threshold voltage regions 1 and 5 (a lower page), the index for the first page group of the block is identified and is used to index the LLR table (e.g., index 2049) to obtain the sets of LLR values LLR_1A, LLR_1B, LLR_1C, LLR_1D, LLR_5A, LLR_5B, LLR_5C, LLR_5D.

Figure 10A:
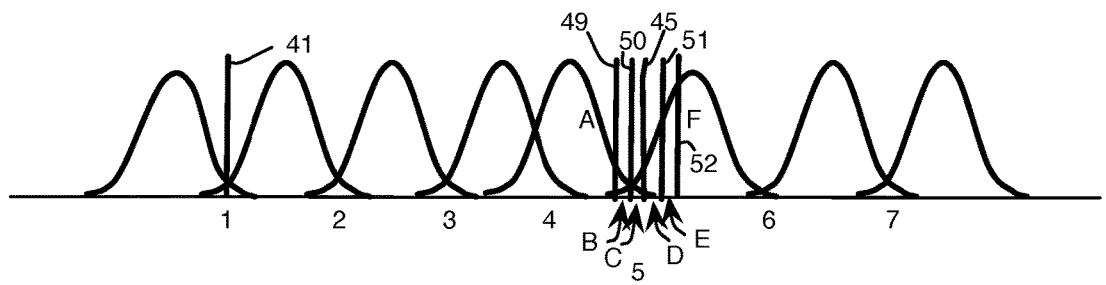
FIG. 10A is a diagram illustrating calculation of LLR for a TLC NAND device in which LLR is calculated for six regions in accordance with an embodiment of the present invention.
Figure 10B:
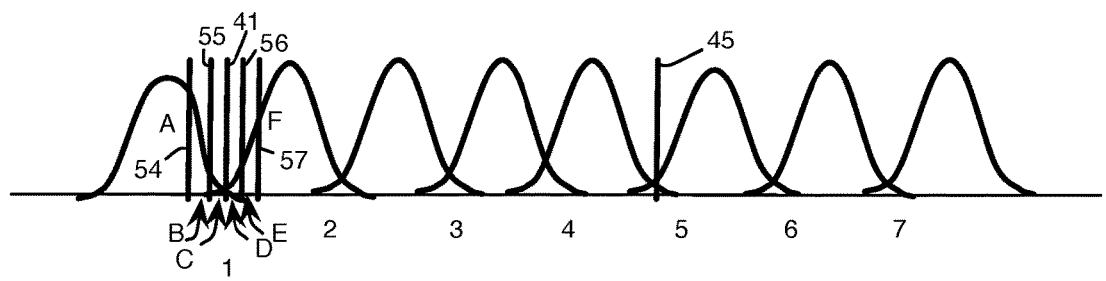
FIG. 10B is a diagram illustrating calculation of LLR for a TLC NAND device in which LLR is calculated for six regions in accordance with an embodiment of the present invention.

In the above example, 4 LLR regions are calculated for each threshold voltage region. When 6 voltage regions are used to calculate LLR, as shown in FIGS. 10A-10B the following additional reads are required: TVSR (0, −2), shown as reference voltages 41, 49, TVSR (0, +2), shown as threshold voltages 41, 52, TVSR (−2, 0), shown as reference voltages 54, 45 and TVSR (+2, 0), shown as threshold voltages 57, 45. The LLR table will include six LLR values for each threshold voltage region required to read the pages of the page group, concatenated, and associated with the corresponding page group index. The LLR table for the exemplary embodiment shown in FIGS. 10A-10B would include, for a page group including only lower pages, the sets of LLR values for region 1 (LLR_1A, LLR_1B, LLR_1C, LLR_1D, LLR_1E, LLR_1F) and the set of LLR values for region 5 (LLR_5A, LLR_5B, LLR_5C, LLR_5D, LLR_5E, LLR_5F).

Figure 11:
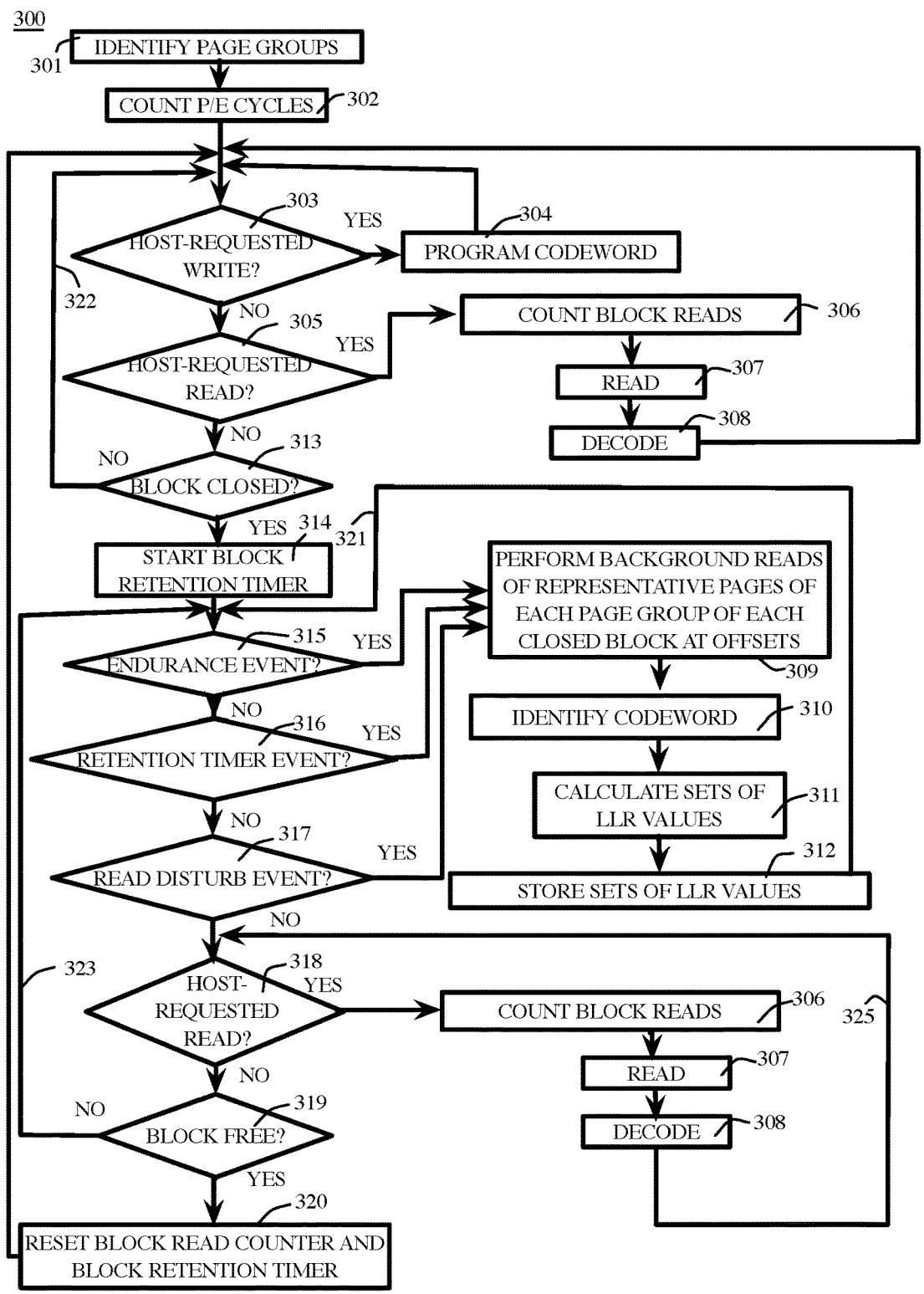
FIG. 11 is a flow diagram illustrating a method in which background reads are performed upon the occurrence of endurance events, retention timer events and read disturb events at a closed block in accordance with an embodiment of the present invention.

In one alternate embodiment, in addition to grouping pages, blocks are grouped to reduce the number of page groups that need to be managed. For example, the blocks of each nonvolatile memory device may be divided into 32 block groups that may correspond to channels of nonvolatile memory system 1, reducing the number of page groups of each nonvolatile memory device 20 to 768 and reducing the number of page groups in nonvolatile memory system 1 to 98,304. In FIG. 11, a method 300 is illustrated that includes identifying page groups of each block 301. Nonvolatile memory controller 11 may identify page groups by querying nonvolatile memory devices 20 to determine the type of nonvolatile memory devices 20 and assigning page groups based on the error characteristics of pages of nonvolatile memory devices 20. The number of program and erase cycles is counted 302. In the present embodiment status circuit 3 is operable for counting the number of program and erase (P/E) cycles of each block of each nonvolatile memory device 20. The number of reads of each block of each nonvolatile memory device 20 is counted 306. In the embodiment shown in FIG. 1 status circuit 3 is operable to determine the number of reads for each block (BLOCK READ COUNT) and store the number of reads for each block in memory storage 4. In the present embodiment, the number of reads for each block is incremented each time that a page of the block is read, both while the block is open 305, 306 and while it is closed 318, 306, and the block read counter is not reset 320 until the block is erased.

When blocks are open the time that the block is open is determined and the open block is closed if the block open time exceeds a predetermined threshold (e.g., 1 hour) to make sure that blocks do not stay open too long. The block may be closed by programming all unprogrammed pages of the open block with dummy data. Also, in embodiments of the present invention, if the block read count exceeds a predetermined open-block read count threshold (e.g., 150,000 reads) the block is sent to reclamation and is copied and erased to prevent read errors in the open block.

When a block is closed 313 a block retention timer is started 314. In the embodiment shown in FIG. 1 status circuit 3 includes a block retention timer that starts timing when each block 22 of each nonvolatile memory device 20 is closed. The block retention time for each block 22 indicates the time that each closed block has remained closed and will not stop or be reset until the block becomes free 320 such as when the block is erased.

Upon the occurrence of one or more of an endurance event 315, a retention timer event 316 and a read disturb event 317 at the closed block, a LLR operation is performed as shown by steps 309-312. In the embodiment shown in FIG. 1 LLR circuit 7 is configured to determine when an endurance event has occurred in step 315 by determining whether the block P/E count exceeds an endurance threshold and is configured to determine whether a retention timer event 316 has occurred by determining whether the block retention time exceeds a retention time threshold. When the block read count exceeds a block read threshold a read disturb event is determined to have occurred 317. In one embodiment the endurance threshold, the retention time threshold and the block read threshold are user programmable so that they may be changed to accommodate the characteristics of different types of NAND devices 20.

Once a page is identified to be read, for MLC and TLC nonvolatile memory devices 20, background reads of representative pages of each page group of a closed block are performed 309 by read circuit 6 at one or more default threshold voltages, at one or more threshold voltage offset that is less than each of the default threshold voltages and at one or more threshold voltage offset that is greater than each of the default threshold voltages. The codewords in the representative pages are identified 310, decoder circuit 8 is configured to decode one of the reads of the exemplary pages of each page group to identify at least one codeword in each page group, and LLR circuit 7 is configured to identify at least one set of updated LLR values for each page group 311 using the read results and the identified codeword(s) in each page group, and the calculated sets of LLR values are stored 312.

Background LLR operations 309-312 continue to be performed on endurance, retention timer and read disturb events as long as a block is closed as shown by line 323, calculating an initial set of LLR values for each page group and continuing to perform steps 309-312 to identify updated sets of LLR values during the lifetime of SSD 1. When the block becomes free 320, such as when the block is erased, background LLR operations 309-312 are no longer performed as shown by line 322 until the block is again closed 313. Host-requested reads 318 are performed by read circuit 9, and decoder circuit 8 decodes 308 the results of each host-requested read using LLR values from the updated set of updated LLR values corresponding to the page group of the page that was read in the host-requested read.

In the present embodiment, a single set of LLR values is calculated for each threshold voltage region required to read a page of a page group and the single set of LLR values is updated during the lifetime of the SSD 1 by overwriting the previously stored LLR values for the particular page group as updated LLR values are calculated. This can be a single LLR table 10 that is repeatedly updated during the lifetime of the SSD 1. For example, the single LLR table 10 of method 100 may include, for each block of SSD 1, a block index and a single set of concatenated LLR values that includes all of the sets of LLR values required to decode a page of the corresponding block. The single LLR table 10 of method 300 includes, for each page group of the SSD 1, a page group index and a single set of concatenated LLR values that includes all of the sets of LLR values required to decode a page of the corresponding page group. The single LLR table 10 for an embodiment that uses block groups and page groups will include, for each page group, a page group index and a single set of concatenated LLR values that includes all of the sets of LLR values required to decode a page of the corresponding page group. The methods and apparatus of the present invention do not store sets of LLR values for different points in the lifetime of the nonvolatile memory devices as is required in prior art systems. Therefore, the method and apparatus of the present invention requires less storage space than prior art SSD's that store multiple sets of LLR values that are used at different points in the lifetime of the SSD.

In one alternate embodiment in which all host-requested reads (steps 105, 107, 307) are performed using a threshold voltage shift read instruction to obtain soft information (or any other type of read instruction that provides soft information), after assembly of SSD 1, and upon initialization of nonvolatile memory controller 11 a LLR table is automatically generated (without user input) by querying the nonvolatile memory devices 20 to identify the characteristics of nonvolatile memory devices 20 to generate and store in the LLR table a unique page group index for each page group and a default set of LLR values for the page group. In an embodiment in which 4 LLR regions are used, the default set of LLR values for each page group is LLR_A=−6, LLR_B=−6, LLR_C=+6 and LLR_D=+6, with all page groups including an identical set of default values when the table is initially generated. In an embodiment in which 6 LLR regions are used, the default set of LLR values for each page group is LLR_A=−6, LLR_B=−6, LLR_C=−6, LLR_D=+6, LLR_E=+6 and LLR_F=+6. In this embodiment, as new LLR values are generated the default sets of LLR values are replaced by the updated LLR values.

In the present embodiment, the host-requested reads of steps 105, 107 and 307 are performed using a threshold voltage shift read instruction. However, it is appreciated that some nonvolatile memory devices 20 may be capable of performing soft reads using other types of instructions. In these embodiments, the soft read instruction for the particular type of nonvolatile memory device 20 of SSD 1 can be used to generate read output plus soft information to be used in the decoding process.

Figure 12:
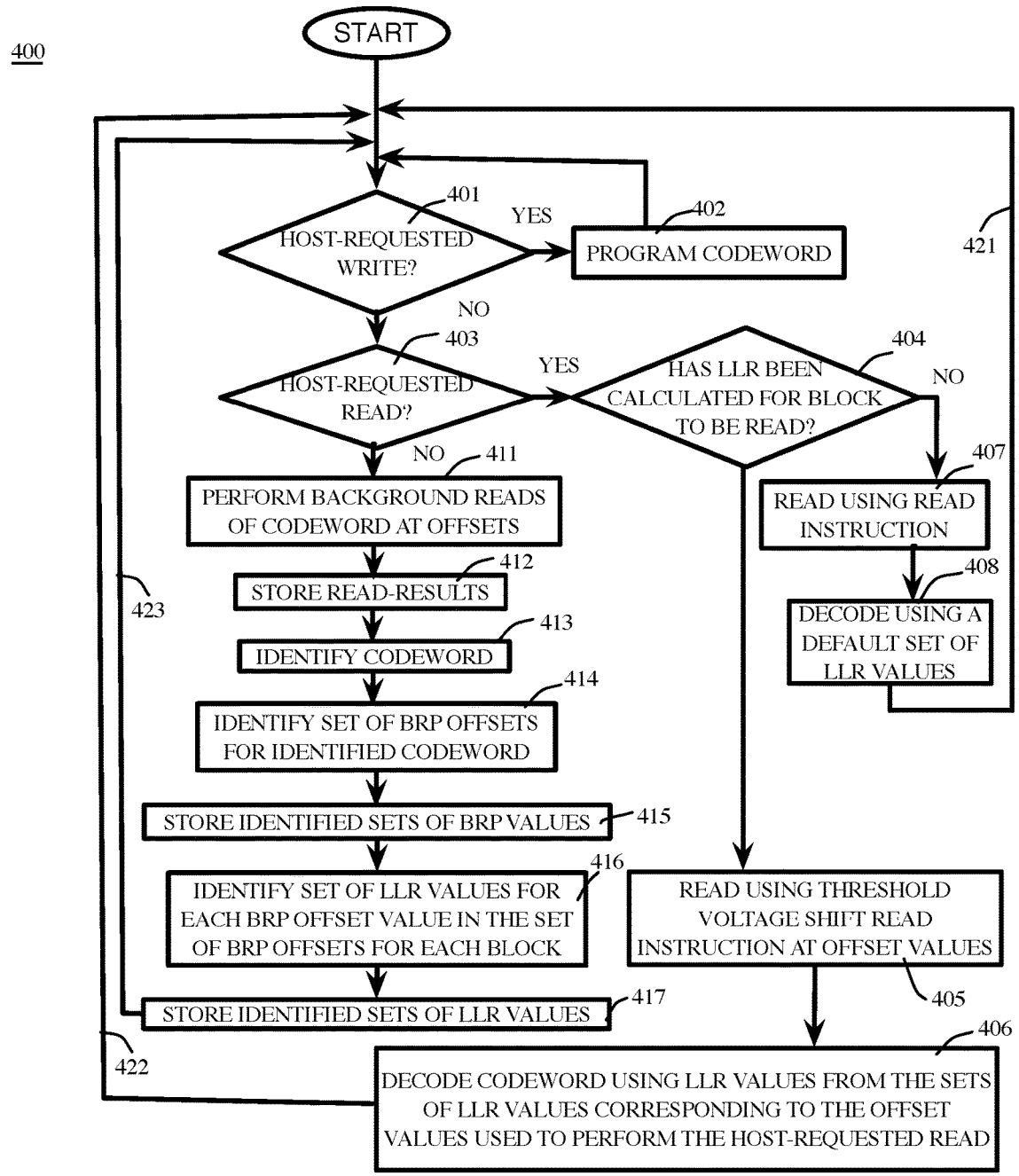
FIG. 12 is a flow diagram illustrating a method for performing background reference positioning and calculating LLR, and for reading and decoding the results of the reads in accordance with an embodiment of the present invention.

FIGS. 12-16 illustrate embodiments in which background reads are performed and are used both for calculating LLR and for identifying the best threshold voltages to use to perform host-requested reads. Referring now to FIG. 12, background reads are performed 411 of a codeword at a plurality of different offsets to each default threshold voltage that is required to perform the background reads and the read results are stored 412. The codeword is identified 413 and in the embodiment shown in FIG. 1, BRP circuit 6 is configured to identify an offset producing the lowest total number of errors for each default threshold voltage using the results of the background reads. This may include identifying errors in each of the background reads by decoding the results of each read of step 411 through ECC. In one embodiment, BRP circuit 6 is operable to receive the results of each read of step 411, store the read results and to couple the read results to decoder circuit 8. Decoder circuit 8 is then operable to decode the results from each read of step 411 to obtain a codeword and the number of errors in the read. The codeword identified in step 413 is then stored along with the read results at the different offsets in temporary storage (e.g., in memory storage 4 or DRAM 13 or in registers 90).

At least one set of updated offsets are identified 414 for each block (or each page group) of each nonvolatile memory device 20 using the errors identified in each read. This may be done by adding the errors from each read at an offset to a threshold voltage to obtain an error sum and determining for each threshold voltage an error sum having the least number of errors. The updated offset value in each set of updated offsets is then identified to be equal to the value of the offset of the error sum having the least number of errors. Because the updated offset value is identified using background reads using a process that may be referred to as "a reference positioning process," the updated offset value may also be referred to hereinafter as a "background reference positioning offset value" or "BRP offset value" and a set of updated offsets may be referred to hereinafter as "set of background reference positioning offsets" or "set of BRP offsets." In the present embodiment step 414 is performed by BRP circuit 6.

A set of LLR values is identified 416 for each BRP offset value in the set of BRP offsets for each block (or page group) of each nonvolatile memory device 20 using the stored read results from step 412 and the codeword identified in step 413. In the present embodiment step 416 is performed by LLR circuit 7 shown in FIG. 1 using the methods discussed in FIGS. 1-11. However, instead of centering the LLR distribution about the default threshold voltage, the LLR distribution is centered around the BRP offset value (which will be the threshold voltage used to perform the read of steps 405 and 407). In the exemplary embodiment shown in FIG. 17 a LLR circuit 7 is shown in which, instead of loading register 92 with the results of the read at the default threshold voltage, it is loaded with the results of the read at the BRP offset value. Similarly, the register 91 is loaded with the results of a read at an offset value less than the BRP offset value (BRP_N) which may be the read at BRP offset value −1, and the register 93 is loaded with the results of the read an offset value that is greater than the BRP offset value (BRP_P), which may be the read at BRP offset value +1. This produces a set of LLR values with a distribution centered around the offset producing the lowest total number of errors.

When no host-requested reads are pending as shown by step 403, normal operation of the nonvolatile memory device is continued, with steps 411-416 performed in the background so as not to affect the latency of nonvolatile memory system 1. When a host-requested read instruction is received and a LLR has been calculated for the block (or page group) to be read, the host-requested read is performed using a threshold voltage shift read instruction at the identified offset producing the lowest total number of errors corresponding to the block (or page group) of the codeword being read. The host-requested read may be performed using a threshold voltage shift read instruction at an offset value equal to each BRP offset value in the set of BRP offsets corresponding to the block (or page group) being read and with soft information offset values centered around the BRP offset value (e.g., reads at BRP offset −1, at BRP offset 0 and at BRP offset +1). In the present embodiment step 405 is performed by read circuit 9.

The codeword is decoded 406 using LLR values from the sets of LLR values calculated in step 416. Thus, each codeword is decoded using LLR values from the sets of LLR values corresponding to the BRP offset used to perform the host-requested read. In the present embodiment step 406 is performed by decoder circuit 8. During the early life of SSD 1 reads may be required for a codeword for which the LLR has not yet been calculated 404, 407. In that event, the read is performed using a conventional read instruction such as a READ PAGE instruction (a hard read) and decoding is performed using a default set of LLR values. Alternatively, the read is performed using threshold voltage shift read instructions centered around the BRP offset value to obtain read results and soft information at the BRP offset value. Since this will only be required during early in the lifetime of the SSD 1, reads at the default threshold voltage are not likely to result in read errors, even when inaccurate LLR values are used. It has been found that, during this period, as long as LLR values close to 0 are not used, decoding is successful. In one embodiment, for LLR regions to the left of the BRP any negative number from −6 to −15 can be used to perform decoding and for LLR regions to the right of the BRP any positive number from +6 to +15 can be used to perform decoding. In one exemplary embodiment, in step 408 the default set of LLR values is LLR_A=−6, LLR_B=−6, LLR_C=+6 and LLR_D=+6.

In an embodiment in which page groups are used, BRP circuit 6 performs background reads of a codeword at offsets to the threshold voltages required to read the codeword to identify the offset producing the lowest total number of errors and is configured to set the BRP offset value to equal the corresponding offset producing the lowest total number of errors so as to identify a single of BRP offset for each page group and a single set of LLR values for each page group when nonvolatile memory devices 20 are SLC devices. When the nonvolatile memory device 20 is a MLC or TLC nonvolatile memory device, in step 414 there will be more than one BRP offset for each page group and step 416 will identify more than one set of corresponding LLR values, which may be concatenated and stored as a combined LLR value set. Accordingly, each combined LLR value set will include all LLR values required to decode a MLC or TLC codeword. In the embodiment shown in FIG. 1, LLR circuit 7 is configured to identify a set of LLR values corresponding to each BRP offset value using errors identified in a background read performed at the BRP offset value, errors identified in a background read performed at an offset that is less than the corresponding BRP offset value and using errors identified in a background read performed at an offset that is greater than the corresponding BRP offset value.

When no host-requested reads are pending, normal operation of the nonvolatile memory device is continued, with steps 411-417 performed in the background so as not to affect the latency of nonvolatile memory system 1. When one or more host-request read instruction is received at host connector receptacle 12, a host-requested read of a codeword stored in the nonvolatile memory device 20 is performed using a threshold voltage shift read instruction at offset values equal to the BRP offset value(s) in the set of BRP offsets corresponding to the block (or page group) being read. In one embodiment BRP circuit 6 is configured to store, in memory storage 4, each identified offset producing the lowest total number of errors as a BRP offset value in a BRP table that includes each identified BRP offset value and corresponding index values (e.g., a block number or page group number), and the read circuit 9 is configured to identify BRP offset values to be used in the host-requested reads by indexing the BRP table using an index value corresponding to the block (or page group) of the page being read. In one embodiment steps 411-417 are repeated to store a BRP offset value for each block (or page group) of nonvolatile memory devices 20, and are further repeated to identify updated BRP offset values. Each time that an updated BRP offset value is identified, the updated BRP offset value may be stored in the BRP table by overwriting any previously stored BRP offset value for the corresponding block (or page group). When nonvolatile memory devices are MLC or SLC devices steps 411-417 are repeated to store more than one BRP offset value for each block (or page group) of nonvolatile memory devices 20 (as a set of BRP offsets), and are further repeated to identify updated offset values.

The codeword is decoded 406 using LLR values from the sets of LLR values calculated in step 416. Each codeword may be decoded using LLR values from the sets of LLR values corresponding to the block of the page being read. In one embodiment LLR circuit 7 is configured to store, in the memory storage 4, a single LLR table 10 that includes each of the identified sets of LLR values and corresponding index values, and decoder circuit 6 is configured to identify LLR values to be used in the host-requested reads by indexing the LLR table using an index value corresponding to the block (or page group) of the page being read.

Figure 13:
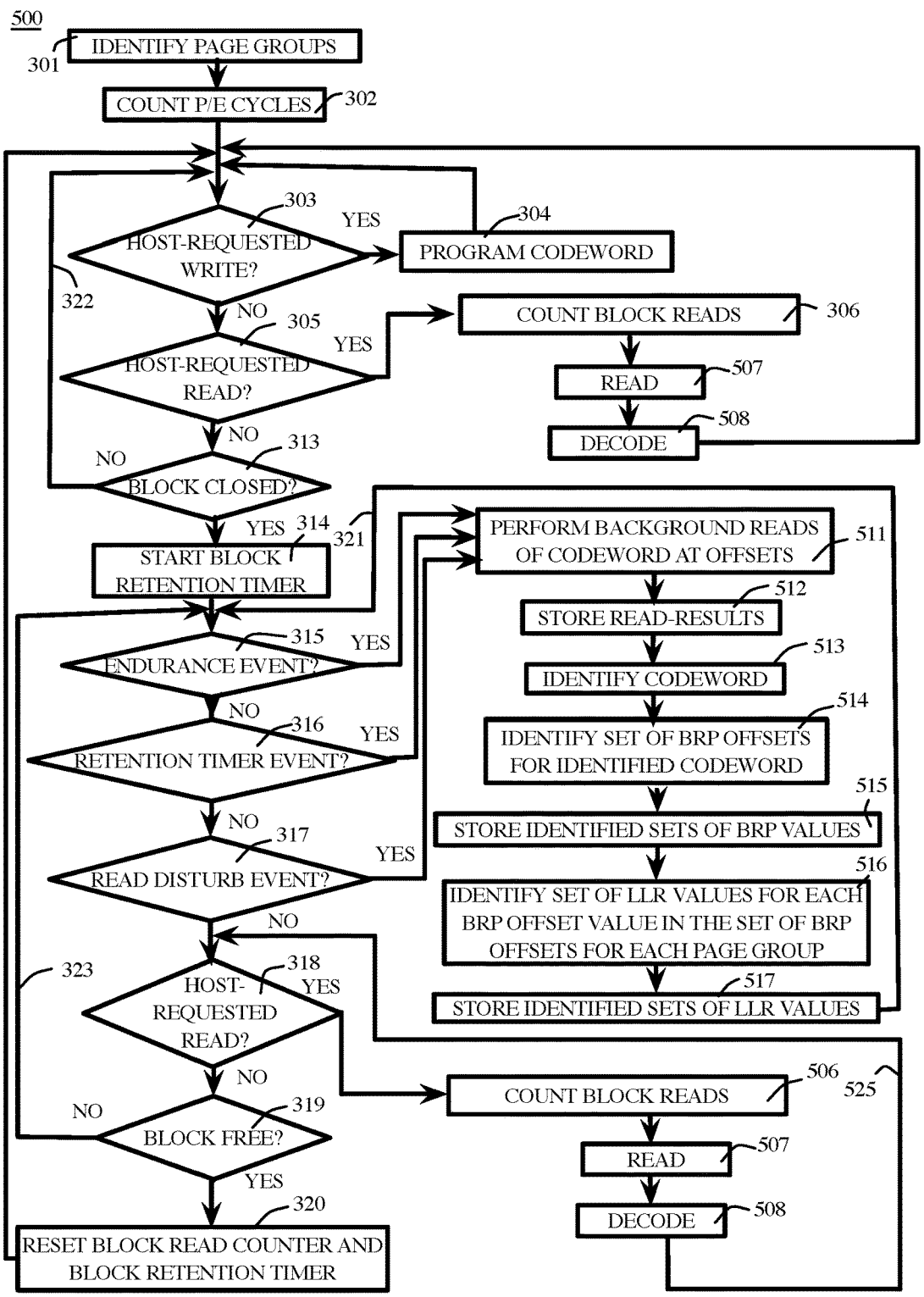
FIG. 13 is a flow diagram illustrating a method for performing background reference positioning and calculating LLR, and for reading and decoding the results of the reads in which background reads are performed upon the occurrence of endurance events, retention timer events and read disturb events at a closed block in accordance with an embodiment of the present invention.

In embodiments of the present invention, steps 411-417 of method 400 are only performed on blocks that are closed, while the particular block is closed, so as to incrementally update BRP offset values and LLR values during the lifetime of the SSD 1. Steps 411-417 may be performed upon the occurrence of particular events, such as upon the occurrence of a certain time period or number of program and erase cycles. In one embodiment, steps 411-417 are only performed upon the occurrence of one or more of an endurance event, a retention timer event and a read disturb event at a closed block and are only performed on the block that is closed during the time period in which the block is closed. Thereby, BRP offset values and LLR values are updated frequently enough so as to maintain accurate sets of BRP offset values and accurate sets of LLR values, but not so often as to negatively impact latency of SSD 1. In one embodiment that is illustrated in FIG. 13, a method 500 is illustrated in which page groups are used in combination with both BRP calculations 514 and LLR calculations 516. In this embodiment, steps 301-306, 313-320 are performed in the same manner as discussed in method 300. In one embodiment, BRP circuit 6 is configured to determine when an endurance event 315, a retention timer event 316 or a read disturb event 517 has occurred.

When read requests are received from the host 305, 318, host-requested reads are performed 507 using a threshold voltage shift read instruction and using the set of updated read offset values corresponding to the page group of the page being read. The reads are decoded 508 using the LLR values corresponding to the threshold voltage region and page group of the page being read. When a LLR has not yet been calculated for the page group of the page being read a default set of LLR values can be used in the same manner as discussed in method 400.

Background reads of representative pages of each page group of a closed block are performed 511, at offsets within each threshold voltage region that is required for reading the representative pages of the closed block. Errors in the background reads of representative pages are identified and BRP offset values are identified 514 to identify an updated set of BRP offset values for each page group of the closed block. In the SLC case, since each updated set of BRP offset values will include a single BRP offset value so a single set of LLR values is identified in step 516. Steps 511-517 continue to be performed on endurance, retention timer and read disturb events as long as a block is closed as shown by line 323, incrementally identifying BRP offset values and sets of LLR values until BRP offset values and LLR values have been identified for all page groups, and steps 511-517 are continued during the operational lifetime of SSD 1 to identify updated BRP offset values and updated sets of LLR values. When the block becomes free 319, 323, such as when the block is erased, steps 511-517 are no longer performed as shown by line 322 until the block is again closed 313.

Figure 14:
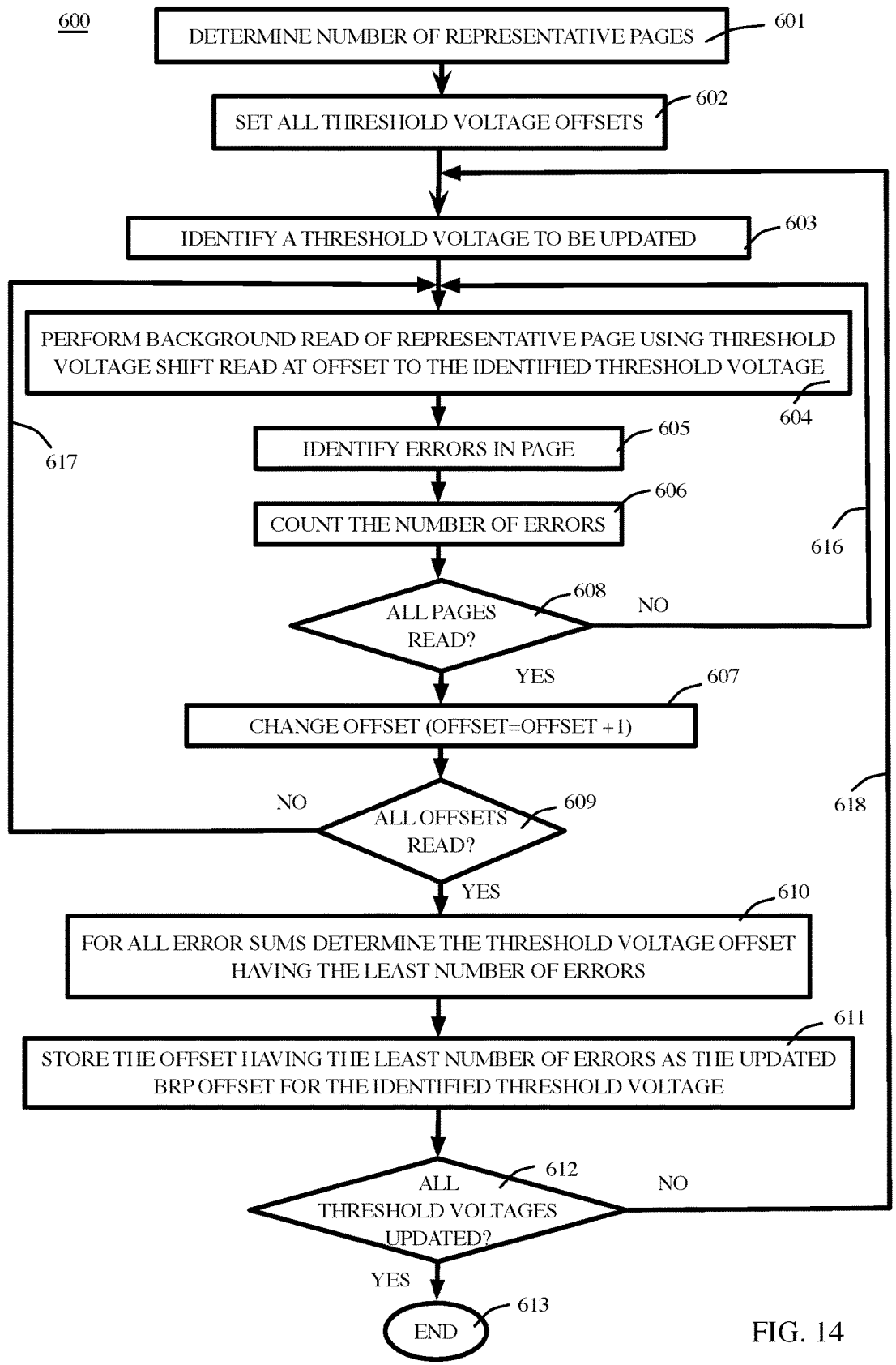
FIG. 14 is a flow diagram illustrating a method for background reference positioning in accordance with an embodiment of the present invention.

FIG. 14 illustrates an exemplary background reference positioning operation 600 in accordance with an embodiment of the present invention. The number of representative pages to be used in each background read step is determined 601. The greater the number of pages tested, the greater the accuracy. However, more pages means that each background reference positioning operation takes more time. Thus, the determination of the number of representative pages is a tradeoff between accuracy and time. In the present embodiment five representative pages are chosen from each page group.

Offsets to threshold voltages required to read the representative pages are set 602 to the offset determined in a previous background reference positioning operation. If no previous background reference positioning operation has been performed, all threshold voltage offsets are set to zero. One of the threshold voltages required to read the representative pages is then identified to be updated 603. In one embodiment, the page that is to be updated is selected by updating pages in a predetermined order, with the page to be updated being the next page in the predetermined order (e.g., start with the representative page with the lowest page number and updating the next-lowest page number in the following step 603) A background read of a representative page is performed 604 using a threshold voltage shift read instruction at an offset to the identified threshold voltage. In one embodiment BRP circuit 6 is operable to perform steps 601-603 and is operable to perform step 604 by sending a background read instruction to read circuit 9 that is operable to send a threshold voltage shift read instruction to the NAND device 20 being read.

Errors in the read of step 604 are identified 605. The total number of errors in each page is counted 606 to obtain an error sum that indicates the total number of errors in the page. In the embodiment shown in FIG. 1, the results of each read operation are received at read circuit 9 and are sent to decoder 8 that is operable to decode the read results to identify the stored codeword. The identified codeword is compared to the results of the reads by performing one or more logic operation at BRP circuit 6 to identify the total number of errors in each read.

This process is repeated for all representative pages 608, 616 and offset values are changed 607 and the process is continued 609, 617 until all representative pages have been read at all offsets values for the threshold voltage identified in step 603 (with other threshold voltage offsets remaining at the values determined in step 602 until selected in step 603). After the representative pages have been read at all offset values the threshold voltage offset producing the least number of errors is determined 610. In one embodiment step 610 includes determining the error sum from the summing of errors from each read at an offset voltage 606 and identifying the threshold voltage offset corresponding to the error sum determined to have the least number of errors. The updated threshold voltage offset is stored 611 as the updated BRP offset value for the identified threshold voltage. After the BRP offset values have been updated for a selected threshold voltage the process is repeated 618 at different identified threshold voltage 603 and using the updated BRP offset stored in step 611 (instead of the corresponding threshold voltage offset from step 602) in subsequent reads 604 of the background reference positioning operation 600, until all threshold voltages have been updated 612 and the process ends 613. In the present embodiment BRP circuit 6 is operable to perform steps 607-612.

In embodiments of the present invention BRP circuit 6 and/or LLR circuit 7 are operable to perform background reads of steps 109, 201, 511 and 604 by sending read instructions to read circuit 9 that, upon receiving the background read instructions, is operable to perform the background reads by assigning a lower priority to the background read instructions than the priority assigned to read instructions generated in response to read requests from a host computing device. In another embodiment read circuit 9 is operable to assign priority values to read instructions including a high priority value, a medium priority value and a low priority value and is operable to assign a high priority value to read instructions generated in response to read requests from a host computing device, and is further operable to prioritize between background read instructions performed in step 511 and read instructions for housekeeping operations by assigning either the medium priority value or the low priority value to a particular one of those read instructions. In the exemplary embodiment shown in FIGS. 10A, 10B, where TLC nonvolatile memory devices 20 are read in step 604, threshold voltage shift reads are performed at read offset values of −2, −1, 0, +1 and +2. Alternatively, more threshold voltage reads may be performed in each step 604.

In the present example, the page group that is being read in step 604, which is identified as exemplary page group 501, is a lower-page page group consisting of only lower pages. Accordingly, the set of threshold voltages that will be required to read each of the pages in the background read 604 will be lower page threshold voltages in regions 1 and 5. Therefore, each threshold voltage shift read instruction for a lower page will include two threshold voltage offsets, and the threshold voltage shift read instruction may be represented as $BRP_{READ}(V_{O1}, V_{O5})$, where "$V_{O1}$" is the threshold voltage offset for reading region 1 and "$V_{O5}$" is the threshold voltage offset for reading region 5.

In the present example, the threshold voltage offset for region 1 and the threshold voltage offset for region 5 are both set at 0 in step 602 based on updated threshold voltage offsets calculated in a previous background reference positioning operation 600. Threshold voltage 45 of region 5 is selected first for updating in step 603. In the example shown in FIG. 10A, in step 404 a first background read ($BRP_{READ}$ (0, −2)) is performed at an offset of 0 for region 1 and an offset of −2 for region 5, shown as reference voltages 41, 49, to obtain a first codeword that is decoded to determine the number of errors in the read of the page 605 and the number of errors in the read is summed 606 to obtain a voltage offset error sum $S_{V5-1}$. A background read of a second page $BRP_{READ}$ (0, −2) is performed 604 to define a second codeword that is decoded to determine the number of errors in the read of the page as shown in step 605 and the number of errors is summed 606 to obtain a voltage offset error sum $S_{V5-1}$ including errors from the reads of the first and second representative pages. A background read of a third page $BRP_{READ}$ (0, −2) is performed 604 to define a third codeword that is decoded to determine the number of errors in the read of the page as shown in step 605 and the number of errors is summed 606 to obtain a voltage offset error sum $S_{V5-1}$ including errors from the reads of the first, second and third representative pages. A background read of a fourth page $BRP_{READ}$ (0, −2) is performed to define a fourth codeword that is decoded to determine the number of errors in the read of the page as shown in step 605 and the number of errors is summed 606 to obtain a voltage offset error sum $S_{V5-1}$ including errors from the reads of the first, second, third and fourth representative pages. A background read of a fifth page $BRP_{READ}$ (0, −2) is performed to define a fifth codeword that is decoded to determine the number of errors in the read of the page as shown in step 605 and the number of errors is summed 606 to obtain the final voltage offset error sum $S_{V5-1}$ that is the sum of all of the errors in the first codeword, the second codeword, the third codeword, the fourth codeword and the fifth codeword. Once all pages have been read 608, 616 the voltage offset is changed 607 by adding one to the voltage offset value used in the previous background read 604 and steps 603-606 are repeated using the voltage offset of the previous step 607 until all pages have been read 608, 616 at all offsets 609, 617. In exemplary embodiment shown in FIG. 10A, steps 604-607 are repeated for all of the other offsets for voltage region 5, while maintaining the offset in the first voltage region at 0. More particularly, the five exemplary pages are read 604 at $BRP_{READ}$ (0, −1), shown as threshold voltages 41, 50 to calculate 606 a second voltage offset error sum $S_{V5-2}$. At the next iteration the offset for region 5 is changed to 0 and the five exemplary pages are read 604 at $BRP_{READ}$ (0, 0), shown as threshold voltages 41, 45 to calculate 606 a third voltage offset error sum $S_{V5-3}$. At the next iteration the offset for region 5 is changed to +1 in step 607 and the five exemplary pages are read at $BRP_{READ}$ (0, +1), shown as threshold voltages 41, 51, to calculate 606 a fourth voltage offset error sum $S_{V5-4}$. At the next iteration the offset for region 5 is changed to +2 in step 607 and the five exemplary pages are read at $BRP_{READ}$ (0, +2), shown as threshold voltages 41, 52 to calculate 606 a fifth voltage offset error sum $S_{V5-5}$. In step 610 the threshold voltage offset having the least number of errors is determined, which will be the least of the error sums $S_{V5-1}$, $S_{V5-2}$, $S_{V5-3}$, $S_{V5-4}$ and $S_{V5-5}$. In the present example, the second voltage offset error sum $S_{V5-2}$ is determined to have the least number of errors, which corresponds to a read offset value of −1 that is stored 611 (e.g., ($V_{BRP5}$=−1)) as a first one of the updated read offset values for the page group. In one embodiment, the updated read offset value is stored by overwriting the corresponding read offset value set in step 602.

Threshold voltage 41 of region 1 is identified next to be updated 603 and reads are performed at different offsets in region 1 until all five pages have been read at all offsets that are to be read, as shown by lines 616-617, while maintaining the threshold voltage offsets to all other regions at the updated threshold offset from step 611 or at the value set in step 602 if the particular threshold voltage has not yet been selected 603 for updating. In the example shown in FIG. 10C, steps 604-607 perform background reads at offsets 41 and 54-57 while maintaining the offset of region 5 at −1 (threshold voltage 50). More particularly, five exemplary pages are read 604 at $BRP_{READ}$ (−2, −1), shown as threshold voltages 54, 50, to calculate 606 a first voltage offset error sum $S_{V1-1}$; five exemplary pages are read 604 at $BRP_{READ}$ (−1, −1), shown as threshold voltages 55, 50, to calculate 606 a second voltage offset error sum $S_{V1-2}$; five exemplary pages are read 604 at $BRP_{READ}$ (0, −1), shown as threshold voltages 41, 50, to calculate 606 a third voltage offset error sum $S_{V1-3}$; and five exemplary pages are read at $BRP_{READ}$ (+1, −1), shown as threshold voltages 56, 50, to calculate 606 a fourth voltage offset error sum $S_{V1-4}$. At the next iteration the offset for region 1 is changed to +2 in step 607 and the five exemplary pages are read at $BRP_{READ}$ (+2, −1), shown as threshold voltages 57, 50, to calculate 606 a fifth voltage offset error sum $S_{V1-5}$. In step 610 the threshold voltage offset having the least number of errors is determined, which will be the least of the error sums $S_{V1-1}$, $S_{V1-2}$, $S_{V1-3}$, $S_{V1-4}$ and $S_{V1-5}$. In the present example, the fourth voltage offset error sum $S_{V1-4}$ is determined to have the least number of errors (e.g., the minimum value) so the read offset value corresponding to $S_{V1-5}$ is stored 611 (e.g., ($V_{BRP1}$=+1)) as a second one of the updated read offset values for the page group. Since the lower page includes only two reference voltages in the present example, all reference voltages have been tested 613. In one embodiment, the result of the calibration process of steps 601-611 is stored in BRP table 5 as the set of updated voltage offset values for the tested page group. In the present embodiment, the results are concatenated and are stored in the threshold voltage shift parameters for the page group as the most recent determined set of updated threshold voltage offsets for the page group and may be represented in the form $VBRP_{501}$=($V_{BRP1}$, $V_{BRP5}$) which in this example has the value $VBRP_{501}$=(+1, −1)).

In the above example the number of errors were identified by decoding the results of each read. In another embodiment, a first read is used to identify the stored codeword (or a known codeword is read) and subsequent read results are compared to the identified codeword to determine the total number of errors in each read, which is summed to obtain error sums $S_{V1-1}$, $S_{V1-2}$, $S_{V1-3}$, $S_{V1-4}$ and $S_{V1-5}$. It has been found that this is faster than decoding each read 604, but requires a known codeword to be stored at least in some blocks.

In the event that data from read 604 is uncorrectable or the determined number of errors 605 exceeds a specific threshold, the closed block may be marked as a "weak block" and the retention time threshold is reduced, in one embodiment halved, the endurance threshold is reduced, in one embodiment halved and the block read threshold is reduced, in one embodiment halved for subsequent steps 605-607 on the weak block. Alternatively, the closed block may be marked as a bad block.

Each time that an updated read offset value is determined based on the occurrence of an endurance event it is stored as $VBRP_{ENDURANCE}$ for the page group (which represents the most recently determined endurance read offset value for the page group) in BRP table 5. Each time that an updated read offset value is determined based on the occurrence of a retention timer event or a read disturb event, the updated read offset value is stored as $VBRP_{RET\_RD}$ for the page group. When the next endurance event occurs, the calculated VBRP for the page group is stored as $VBRP_{ENDURANCE}$ (e.g., by overwriting the previous $VBRP_{ENDURANCE}$ value). Each time that $VBRP_{ENDURANCE}$ is calculated, it is also stored as $VBRP_{RET\_RD}$ for the page group (e.g., by overwriting the previous $VBRP_{RET\_RD}$ value). Each time that an updated threshold voltage offset is determined based on the occurrence of a retention timer event or a read disturb event it is stored as $VBRP_{RET\_RD}$ for the page group (e.g., by overwriting the previous $VBRP_{RET\_RD}$ value). The read offset value stored as $VBRP_{RET\_RD}$ for the page group thus represents the most recently determined updated read offset value for the page group, and may be from an endurance event, a retention timer event or a read disturb event, and is a temporary voltage threshold offset value that takes into account the changes to the threshold voltage while the block is closed.

Figure 15:
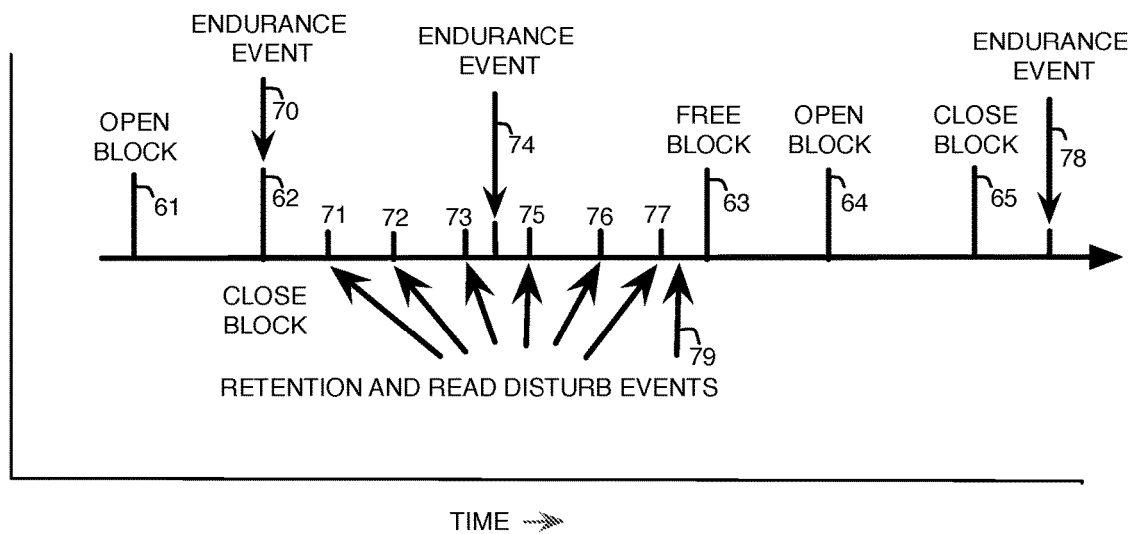
FIG. 15 is a diagram illustrating exemplary endurance events, retention timer events and read disturb events with time shown in the horizontal axis in accordance with an embodiment of the present invention.
Figure 16:
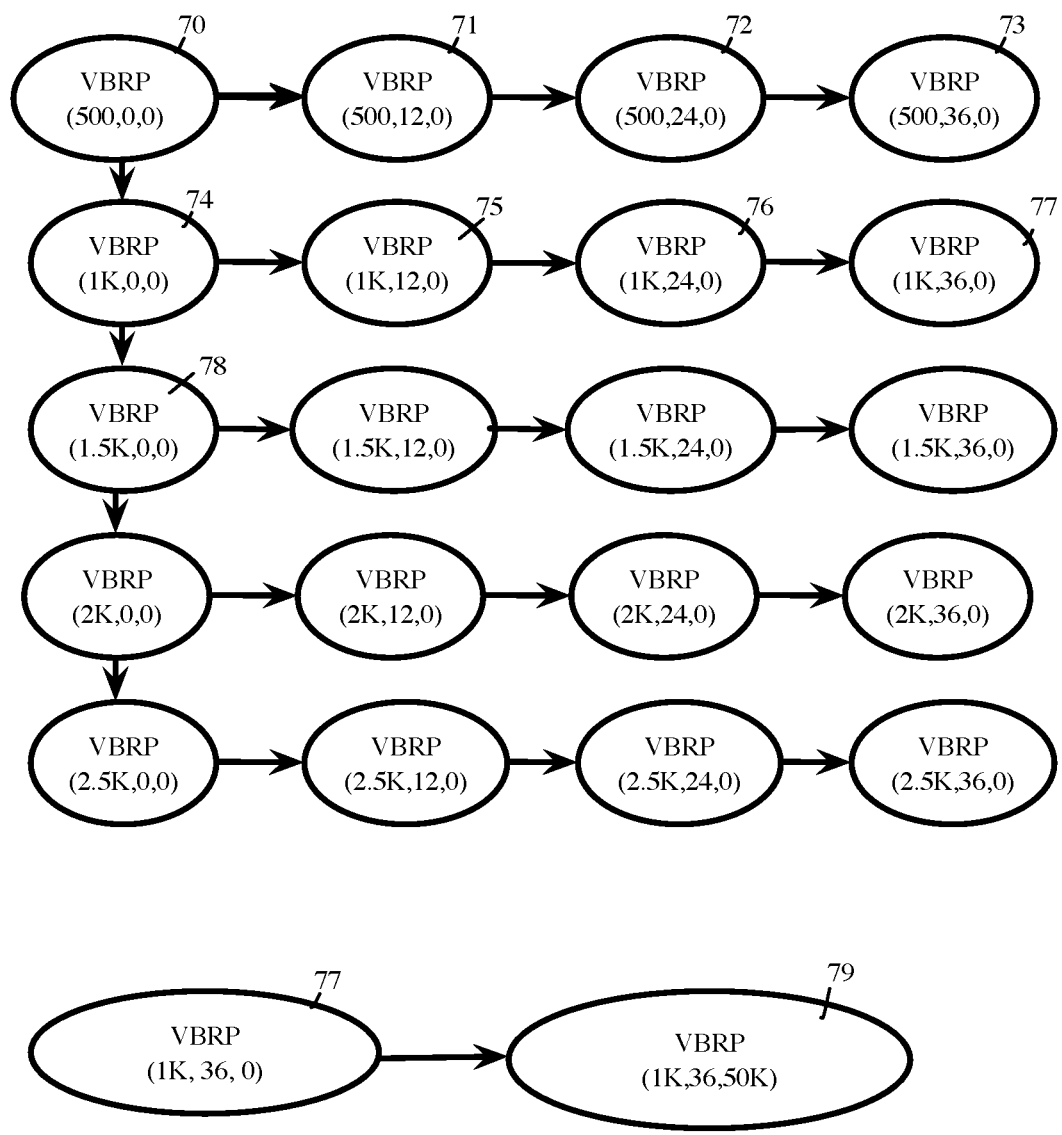
FIG. 16 is a diagram illustrating exemplary background reads in accordance with an embodiment of the present invention.

In one embodiment that is illustrated in FIGS. 15-16 the endurance threshold is set at 500 P/E cycles such that every 500 P/E cycles constitutes an endurance event and the retention threshold is set at 12 hours such that a retention timer event occurs after every 12 hours that the block is closed. The read disturb threshold is set at 50,000 reads such that a read disturb event occurs after every 50,000 reads of the block read counter. FIG. 15 shows an exemplary timeline and FIG. 16 shows an event matrix that includes the events of FIG. 15 in addition to a number of subsequent events. In the following example, in the term VBRP (x,y,z), x represents the endurance threshold at which VBRP is calculated, y represents the retention time threshold at which VBRP is calculated and z represents the block read threshold at which VBRP is calculated. Each arrow in FIG. 15 represents the starting point for a background reference positioning operation. At 61 the block is open and at 62 the block is closed. In this example, the P/E cycle count exceeds 500 when the block is closed 62 so an endurance event 70 is determined to have occurred when the block is closed 62. A background reference positioning operation is performed and the results are stored as both $VBRP_{ENDURANCE}$ and as $VBRP_{RET\_RD}$. After 12 hours from close block 62 a first retention timer event 71 is determined to have occurred (12-hour retention timer event). Since the calculations for retention timer events and read disturb events use $VBRP_{RET\_RD}$ as the starting reference threshold voltage offset, $VBRP_{RET\_RD}$ from the 500 P/E event 70 is used to calculate a new updated threshold voltage offset VBRP (500, 12, 0) which is stored as $VBRP_{RET\_RD}$. Upon the occurrence of a second retention timer event 72 (24-hour retention timer event) $VBRP_{RET\_RD}$ from the 12-hour retention timer event 71 is used as the starting reference threshold voltage offset in step 602 and the new updated offset value is stored $VBRP_{RET\_RD}$ (500, 24, 0). Similarly, upon the occurrence of a third retention timer event 73 (36-hour retention timer event) $VBRP_{RET\_RD}$ (from the 24-hour retention timer event 72) is used as the starting reference threshold voltage offset in step 602 and the new updated offset value is stored as $VBRP_{RET\_RD}$ (500, 36, 0).

At endurance events the VBRP calculated in the most recent endurance event ($VBRP_{ENDURANCE}$) for the page group is used as the starting reference threshold voltage offset in step 602. Accordingly, upon the second endurance event 74 (at 1,000 P/E cycles) $VBRP_{ENDURANCE}$ from the 500 P/E event 70 is used as the starting reference threshold voltage offset in step 602.

Upon the occurrence of a retention timer event, the most recently calculated updated read offset value is used as the starting reference threshold voltage offset in step 602, which can be an updated VBRP calculated in response to the occurrence of an endurance event, a retention timer event or a read disturb event. Since each VBRP calculated from an endurance event is stored as both $VBRP_{RET\_RD}$ and $VBRP_{ENDURANCE}$, the value $VBRP_{RET\_RD}$ always reflects the most recent updated threshold voltage offset for the page group. Accordingly, upon the occurrence of a retention timer event 75 (12-hour retention timer event), $VBRP_{RET\_RD}$ from 1K P/E event 74 is used as the starting reference threshold voltage offset in step 602. Upon the occurrence of a second retention timer event 76 (24-hour retention timer event), $VBRP_{RET\_RD}$ (from the 12-hour retention timer event 75) is used as the starting reference threshold voltage offset in step 602. Similarly, upon the occurrence of a third retention timer event 77 (36-hour retention timer event), $VBRP_{RET\_RD}$ (from the 24-hour retention timer event 76) is used as the starting reference threshold voltage offset in step 602.

Upon the occurrence of a read disturb event 79, the most recently calculated updated read offset value is used as the starting reference threshold voltage offset in step 602, which can be an updated VBRP calculated in response to the occurrence of an endurance event, a retention timer event or a read disturb event. Since each VBRP calculated from an endurance event is stored as both $VBRP_{RET\_RD}$ and $VBRP_{ENDURANCE}$, the value $VBRP_{RET\_RD}$ always reflects the most recent updated threshold voltage offset for the page group. Accordingly, at an exemplary 50,000 read-count read disturb event 79, $VBRP_{RET\_RD}$ (1K, 36, 0) is used as the starting threshold voltage offset in step 602 and the resulting VBRP (1K, 36, 50K) is stored as $VBRP_{RET\_RD}$.

When performing background reference positioning operations for endurance events, it has been found that better results are obtained when the read count is not too high. Accordingly, in embodiments of the present invention, a limit on the number of read counts is applied when determining whether or not a background reference positioning operation should be performed. In one such embodiment, when the number of P/E cycles constitutes an endurance event, the calculation of background reference positioning step 603-612 is not performed when the read count exceeds a quality threshold (e.g., 25,000 reads).

When a block is free 63, previously determined values of $VBRP_{RET\_RD}$ are no longer useful for determining voltage threshold correction. Therefore, the background reference positioning operation immediately following the block erase will use the VBRP calculated in the most recent endurance event ($VBRP_{ENDURANCE}$) for the page group as the starting reference threshold voltage offset in step 602, whether it is a VBRP calculation for an endurance event, a retention timer event or a read disturb event. If an endurance event is not determined to have occurred at close block event 65 and a retention or read disturb event 78 is determined to have occurred, $VBRP_{ENDURANCE}$ from the 1,000 P/E event 74 is used as the starting reference threshold voltage in step 602 and the calculated VBRP is stored as $VBRP_{RET\_RD}$.

As previously discussed, after a block is free 63, previously determined values of $VBRP_{RET\_RD}$ are no longer useful. Accordingly, in embodiments of the present invention, when reads are performed after a block is closed and before a first $VBRP_{RET\_RD}$ is determined for the closed block, reads continue to be performed using the VBRP calculated in the most recent endurance event ($VBRP_{ENDURANCE}$) for the page group until the first $VBRP_{RET\_RD}$ is determined following the closed block event.

The use of both background reference positioning and background LLR calculation results in fewer decode errors and hence fewer read retry operations, providing a nonvolatile memory system 1 with reduced latency as compared to systems that use conventional read operations. Moreover, BER is reduced, extending the lifetime of nonvolatile memory system 1.

In the example shown in FIG. 16, where the most recent determined set of updated BRP offsets for the page group is represented in the form $VBRP_{501}=(V_{BRP1}, V_{BRP5})$ having the value $VBRP_{501}=(+1, -1)$, a first set of LLR values is calculated for the first BRP offset value $V_{BRP1}$, and a second set of LLR values is calculated for the second BRP offset value $VBRP_5$. In the following example in which a first set of LLR values is calculated for BRP offset value $VBRP_1$, a first LLR value (LLRA_$V_{BRP1}$) will indicate the error for reads in region A, a second LLR value (LLRB_$V_{BRP1}$) will indicate the error for reads in region B, a third LLR value (LLRC_$V_{BRP1}$) will indicate the error for reads in region C, and a fourth LLR value (LLRD_$V_{BRP1}$) will indicate the error for reads in region D. Thus, there is one LLR set for each reference describing the voltage regions, with the LLR distribution centered on the most recent determined BRP offset value for the threshold voltage region.

Figure 10C:
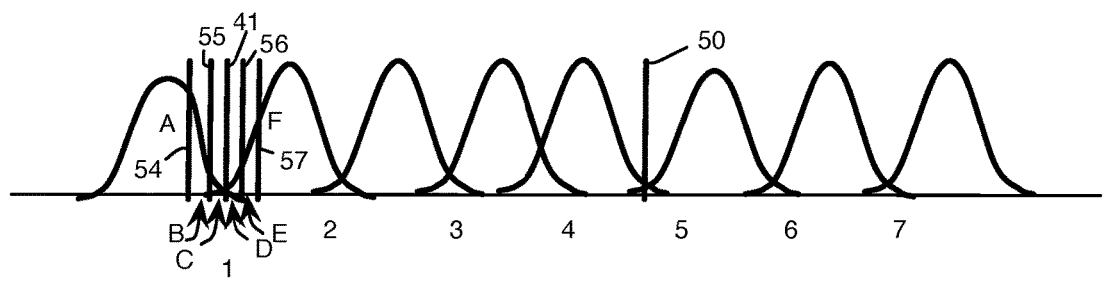
FIG. 10C is a diagram illustrating calculation of BRP for a TLC NAND device in accordance with an embodiment of the present invention.
Figure 17:
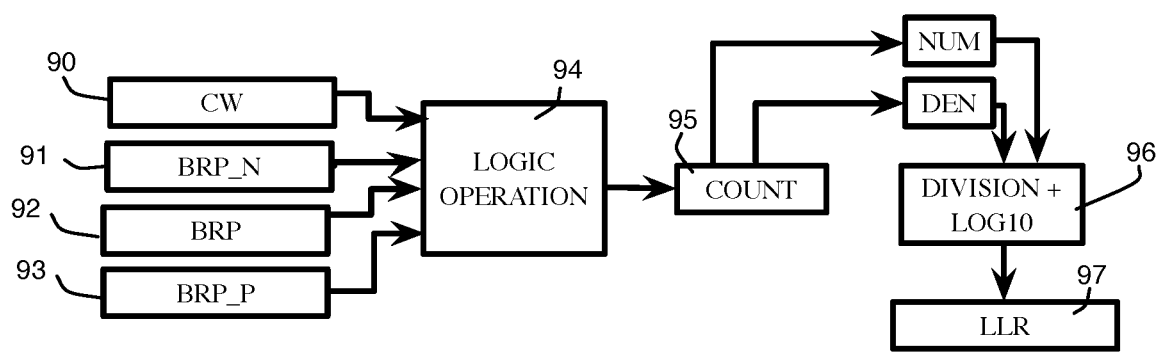
FIG. 17 is a diagram illustrating portions of a LLR circuit in accordance with an embodiment of the present invention.

Since in the present example $V_{BRP1}$, is +1, shown as line 56 in FIGS. 10A-10C, to calculate the set of LLR values corresponding to $V_{BRP1}$, the read results at offset 0 will be stored in register 93 as BRP_N, the read at +1 will be stored in register 92 of FIG. 17 as BRP and the read results at +2 will be stored in register 93 as BRP_P and the calculated LLRA_$V_{BRP1}$, LLRB_$V_{BRP1}$, LLRC_$V_{BRP1}$ and LLRD_$V_{BRP1}$ may be concatenated and stored in LLR table 10 as a first set of LLR values $LLR_{501}$=$V_{BRP1}$=(LLRA_$V_{BRP1}$, LLRB_$V_{BRP1}$, LLRC_$V_{BRP1}$, LLRD_$V_{BRP1}$).

Since in the present example $V_{BRP5}$, is −1, which is shown as line 50 in FIGS. 10A-10C, to calculate the set of LLR offsets corresponding to $V_{BRP5}$, the read results at offset −2 will be stored in register 93 as BRP_N, the read at −1 will be stored in register 92 of FIG. 17 as BRP and the read results at 0 will be stored in register 93 as BRP_P and the calculated LLRA_$V_{BRP5}$, LLRB_$V_{BRP5}$, LLRC_$V_{BRP5}$ and LLRD_$V_{BRP5}$ are concatenated and stored in LLR table 10 as a second set of LLR values $LLR_{501}$—$V_{BRP5}$=(LLRA_$V_{BRP5}$, LLRB_$V_{BRP5}$, LLRC_$V_{BRP5}$, LLRD_$V_{BRP5}$).

In alternate embodiment, all BRP offset values are set to 0 and all LLR values are set to default values (e.g., −6, +6) after nonvolatile memory controller 11 is initialized to obtain an initial BRP table 5 and LLR table 10. In this embodiment, each calculated set of BRP offsets will be an updated set of BRP offsets and each identified set of LLR values will be an updated set of LLR values.

By performing testing on the actual NAND device being used, and by continuing to perform background testing as the NAND device ages, the methods and apparatus of the present invention provide LLR values that accurately indicate the error probability of soft reads. This reduces BER and extends the useful life of the NAND flash memory chips. In addition, the number of read errors is reduced, resulting in reduced read latency.

In various embodiments, the system of the present invention may be implemented in a Field Programmable Gate Array (FPGA) or Application Specific Integrated Circuit (ASIC).

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims and not by the above detailed description.

What is claimed is:

1. A method comprising:
   programming, at a nonvolatile memory controller, codewords into each of a plurality of nonvolatile memory devices in response to receiving host-requested write instructions at the nonvolatile memory controller;
   performing, at the nonvolatile memory controller, background reads of at least one codeword of the programmed codewords in a block of the nonvolatile memory devices at a default threshold voltage, at one or more threshold voltage offset that is less than the default threshold voltage and at one or more threshold voltage offset that is greater than the default threshold voltage;
   decoding, at a decoder circuit of the nonvolatile memory controller, at least one of the background reads to identify the at least one codeword;
   identifying, at the nonvolatile memory controller, a set of log likelihood ratio (LLR) values using the read results and the identified at least one codeword;
   continuing, at the nonvolatile memory controller, the performing background reads, the decoding at least one of the background reads and the identifying to identify a set of LLR values for each block of the nonvolatile memory devices;
   further continuing the performing background reads, the decoding at least one of the background reads and the identifying to identify updated sets of LLR values;
   performing, at the nonvolatile memory controller, a host-requested read of one of the nonvolatile memory devices; and
   decoding, at the nonvolatile memory controller, the results of the host-requested read using LLR values from the updated set of LLR values corresponding to the block that was read in the host-requested read.

2. The method of claim 1 wherein the background reads are only performed on closed blocks.

3. The method of claim 1 wherein the background reads are only performed on closed blocks and are only performed upon the occurrence of one or more of an endurance event, a retention timer event and a read disturb event at a closed block.

4. The method of claim 1 further comprising:
   storing the results of the background reads;
   identifying an offset producing the lowest total number of errors for each default threshold voltage using the results of the background reads; and
   wherein the performing a host-requested read further comprises performing the host-requested read using a threshold voltage shift read instruction at the identified offset producing the lowest total number of errors corresponding to the block of the codeword being read.

5. The method of claim 4 further comprising:
   storing each identified offset producing the lowest total number of errors as a background reference positioning (BRP) value in a BRP table, the BRP table including a block index corresponding to each BRP value that indicates the corresponding block number;
   continuing the performing background reads, the storing, the decoding at least one of the background reads and the identifying an offset producing the lowest total number of errors to store a BRP value for each block of the nonvolatile memory devices;
   further continuing the performing background reads, the storing, the decoding at least one of the background reads and the identifying an offset producing the lowest total number of errors to identify updated offset values;
   each time that an updated offset value is identified, storing the updated offset value in the BRP table by overwriting any previously stored BRP value for the corresponding block.

6. The method of claim 1 wherein each block includes a plurality of pages divided into page groups;
   wherein the performing background reads further comprises performing background reads of representative pages of a page group at a default threshold voltage, at one or more threshold voltage offset that is less than the default threshold voltage and at one or more threshold voltage offset that is greater than the default threshold voltage;

wherein the identifying a set of LLR values further comprises identifying a set of LLR values for each page group using the read results and the identified at least one codeword; and wherein the decoding the results of the host-requested reads further comprises decoding the results of the host-requested reads using LLR values from the set of updated LLR values corresponding to the page group of the page that was read.

7. The method of claim 6 further comprising:
generating a LLR table;
storing each of the identified sets of LLR values in the LLR table along with an index identifying the corresponding page group; and
wherein each time that an updated set of LLR values is identified, storing the updated set of LLR values in the LLR table by overwriting the corresponding set of LLR values previously stored in the LLR table.

8. The method of claim 7 wherein the decoding the results of the host-requested reads further comprises decoding the results of the host-requested reads by indexing the LLR table using an index value corresponding to the page group of the page that was read.

9. The method of claim 4 further comprising:
generating a BRP table that includes BRP values and corresponding indexes corresponding to each page group;
continuing the performing background reads, the storing, the decoding at least one of the background reads, the identifying to identify a set of LLR values for each block of the nonvolatile memory devices; and
storing each identified offset producing the lowest total number of errors in the BRP table as the BRP value for the corresponding page group, such that each BRP value in the BRP table is the most recent identified offset producing the lowest total number of errors corresponding to the page group.

10. The method of claim 1 further comprising:
wherein the performing background reads further comprises performing background reads of representative pages of a block at a default threshold voltage within each threshold voltage region required to read the representative pages, at one or more threshold voltage offset that is less than the default threshold voltage within each threshold voltage region required to read the representative pages and at one or more threshold voltage offset that is greater than the default threshold voltage within each threshold voltage region required to read the representative pages;
wherein the identifying a set of LLR values further comprises identifying a set of LLR values corresponding to each threshold voltage region required to read the representative pages using the stored read results and the identified at least one codeword;
wherein the continuing the performing background reads further comprises continuing the performing background reads, the decoding at least one of the background reads and the identifying, to identify a set of LLR values corresponding to each threshold voltage region required to read the representative pages of each block; and
wherein the further continuing the performing background reads further comprises continuing the performing background reads, the decoding at least one of the background reads and the identifying, to identify an updated set of LLR values corresponding to each threshold voltage region required to read the representative pages.

11. A nonvolatile memory controller comprising:
a write circuit coupled to a plurality of nonvolatile memory devices, the write circuit configured to program codewords into each of a plurality of nonvolatile memory devices in response to receiving host-requested write instructions;
a read circuit configured to perform background reads of at least one of the programmed codewords in a block of the nonvolatile memory devices at a default threshold voltage, at one or more threshold voltage offset that is less than the default threshold voltage and at one or more threshold voltage offset that is greater than the default threshold voltage;
a decoder circuit configured to decode at least one of the background reads to identify the at least one codeword;
a log likelihood ratio (LLR) circuit configured to identify a set of LLR values corresponding to the default threshold voltage using the read results and the identified at least one codeword;
wherein the nonvolatile memory controller is configured to continue to perform the background reads, to decode at least one of the background reads, and to identify sets of LLR values, to identify a set of LLR values for each block of the nonvolatile memory devices;
wherein the nonvolatile memory controller is configured to further continue to perform the background reads, to decode at least one of the background reads, and to identify sets of LLR values, to identify updated sets of LLR values;
a read circuit configured to perform a host-requested read of the nonvolatile memory devices; and
a decoder circuit configured to decode the results of the host-requested read using LLR values from the updated set of LLR values corresponding to the block that was read in the host-requested read.

12. The nonvolatile memory controller of claim 11 further comprising:
a background reference positioning (BRP) circuit configured to identify an offset producing the lowest total number of errors for each default threshold voltage using the results of the background reads; and
wherein the performing a host-requested read further comprises performing the host-requested read using a threshold voltage shift read instruction at the identified offset producing the lowest total number of errors corresponding to the block of the codeword being read.

13. The nonvolatile memory controller of claim 12 further comprising:
a BRP table coupled to the BRP circuit and to the read circuit, the BRP table including BRP values and corresponding indexes for each block of the nonvolatile memory devices;
wherein each identified offset producing the lowest total number of errors is stored as a BRP value in the BRP table by overwriting any previously stored BRP value for the corresponding block.

14. The nonvolatile memory controller of claim 11 wherein each block includes a plurality of pages divided into page groups;
wherein the read circuit is configured to perform background reads of representative pages of a page group at one or more default threshold voltages, at one or more threshold voltage offset that is less than each of the default threshold voltages and at one or more threshold voltage offset that is greater than each of the default threshold voltages;

wherein the decoder circuit is configured to decode one of the reads of the exemplary pages of each block to identify at least one codeword in each page group;

wherein the LLR circuit is configured to identify at least one set of updated LLR values for each block using the read results and the identified at least one codeword in each page group; and wherein the read circuit is configured to perform a host-requested read of the nonvolatile memory devices and the decoder circuit is configured to decode the results of the host-requested read using LLR values from the set of updated LLR values corresponding to the page group of the page that was read in the host-requested read.

15. The nonvolatile memory controller of claim 11 wherein the background reads are only performed on closed blocks.

16. The nonvolatile memory controller of claim 14 wherein the background reads are only performed on closed blocks and are only performed upon the occurrence of one or more of an endurance event, a retention timer event and a read disturb event at a closed block.

17. The nonvolatile memory controller of claim 16 wherein:

the nonvolatile memory controller is configured to determine a number of program and erase cycles for each block of the nonvolatile memory device and wherein the nonvolatile memory controller is configured to determine that an endurance event has occurred each time that the determined number of program and erase cycles of the closed block reaches a threshold number of program and erase cycles;

wherein the nonvolatile memory controller is configured to determine closed block retention time for each closed block of the nonvolatile memory device, and wherein the nonvolatile memory controller is configured to determine that a retention timer event has occurred each time that the closed block retention time reaches a threshold retention time; and wherein the nonvolatile memory controller is configured to determine a number of reads for each block of the nonvolatile memory device and wherein the nonvolatile memory controller is configured to determine that a read disturb event has occurred each time that the number of reads for the closed block reaches a threshold number of reads.

18. A nonvolatile memory system comprising:
a plurality of nonvolatile memory devices;
a nonvolatile memory controller that is coupled to the nonvolatile memory devices, the nonvolatile memory controller comprising:
  a write circuit configured to program the nonvolatile memory devices in response to receiving host-requested write instructions that include user data to store the user data in the nonvolatile memory devices;
  a read circuit configured to perform background reads of representative pages of a page group at a default threshold voltage within each threshold voltage region required to read the representative pages, at one or more threshold voltage offset that is less than the default threshold voltage within each threshold voltage region required to read the representative pages and at one or more threshold voltage offset that is greater than the default threshold voltage within each threshold voltage region required to read the representative pages;
  a decoder circuit configured to decode the results from some of the background reads of representative pages to identify codewords stored in the representative pages;
  a log likelihood ratio (LLR) circuit configured to identify a set of LLR values corresponding to each threshold voltage region required to read the representative pages using the read results and the identified codewords; and
wherein the read circuit is configured to continue to perform the background reads, to decode the results from some of the background reads, and the LLR circuit is configured to continue to identify sets of LLR values, to identify a set of LLR values corresponding to each threshold voltage region required to read the representative pages of each page group;
wherein the read circuit is further configured to continue to perform the background reads and the LLR circuit is further configured to identify updated sets of LLR values; and
wherein the read circuit is configured to perform host-requested reads of the nonvolatile memory devices and the decoder circuit is configured to decode the results of the host-requested reads using LLR values from the updated set of LLR values corresponding to the page group of the page that was read in the host-requested read.

19. The nonvolatile memory system of claim 18 wherein the LLR circuit is configured to store each of the identified sets of LLR values in a LLR table along with an index identifying the corresponding page, and wherein each time that an updated set of LLR values is identified the LLR circuit is configured to store the updated set of LLR values in the LLR table by overwriting the corresponding set of LLR values previously stored in the LLR table.

20. The nonvolatile memory system of claim 19 wherein the decoder circuit is configured to identify LLR values to be used for decoding the host-requested reads by indexing the LLR table using an index value corresponding to the page group of the page being read.

* * * * *